(12) United States Patent
Ren

(10) Patent No.: US 12,217,929 B2
(45) Date of Patent: Feb. 4, 2025

(54) SYSTEMS AND METHODS FOR CHROMATIC ABERRATION MITIGATION

(71) Applicant: ASML NETHERLANDS B.V., Veldhoven (NL)

(72) Inventor: Yan Ren, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 414 days.

(21) Appl. No.: 17/785,886

(22) PCT Filed: Dec. 16, 2020

(86) PCT No.: PCT/EP2020/086594
§ 371 (c)(1),
(2) Date: Jun. 15, 2022

(87) PCT Pub. No.: WO2021/122862
PCT Pub. Date: Jun. 24, 2021

(65) Prior Publication Data
US 2023/0028084 A1    Jan. 26, 2023

(30) Foreign Application Priority Data

Dec. 19, 2019  (EP) ..................................... 19218291
Sep. 9, 2020   (EP) ..................................... 20195388

(51) Int. Cl.
*H01J 37/153*  (2006.01)
(52) U.S. Cl.
CPC ..... *H01J 37/153* (2013.01); *H01J 2237/1534* (2013.01)
(58) Field of Classification Search
CPC .......................... H01J 37/153; H01J 2237/1534
See application file for complete search history.

(56) References Cited

U.S. PATENT DOCUMENTS

| 7,365,338 B2 * | 4/2008 | Kruit ...................... B82Y 10/00 250/398 |
| 9,673,018 B2 | 6/2017 | Nomura |

(Continued)

FOREIGN PATENT DOCUMENTS

| CN | 101248505 B | 12/2010 |
| CN | 103843105 A | 6/2014 |

(Continued)

OTHER PUBLICATIONS

Office Action issued by the Intellectual Property Office (IPO) in related ROC (Taiwan) Patent Application No. 109144173, mailed Sep. 30, 2021 (13 pgs.).

(Continued)

*Primary Examiner* — Sean M Luck
(74) *Attorney, Agent, or Firm* — Finnegan, Henderson, Farabow, Garrett & Dunner, LLP

(57) ABSTRACT

A method of reducing aberration comprises separating charged particles of a beam based on energy of the charged particles to form beamlets, each of the beamlets configured to include charged particles at a central energy level; and deflecting the beamlets so that beamlets having different central energy levels are deflected differently. An aberration corrector comprises a dispersive element configured to cause constituent parts of a beam (e.g. a charged particle beam) to spread apart based on energy; an aperture array configured to form beamlets from the spread apart beam; and a deflector array configured to deflect the beamlets differently based on central energy levels of particles that form the beamlets.

15 Claims, 18 Drawing Sheets

(56) References Cited

U.S. PATENT DOCUMENTS

| | | | |
|---|---|---|---|
| 9,778,377 B2 * | 10/2017 | Mele | H01J 37/244 |
| 10,176,965 B1 * | 1/2019 | Breuer | H01J 37/10 |
| 2006/0255269 A1 | 11/2006 | Kawasaki et al. | |
| 2012/0074315 A1 * | 3/2012 | Krivanek | H01J 37/05 |
| | | | 250/311 |
| 2017/0125206 A1 | 5/2017 | Ren et al. | |
| 2019/0355545 A1 * | 11/2019 | Zeidler | H01J 37/21 |

FOREIGN PATENT DOCUMENTS

| | | |
|---|---|---|
| CN | 102737932 B | 8/2016 |
| JP | 2014229481 A | 12/2014 |
| TW | I604499 B | 11/2017 |
| TW | I621149 B | 4/2018 |

OTHER PUBLICATIONS

International Search Report and Written Opinion received from the International Search Authority issued in related International Application No. PCT/EP2020/086594 mailed May 31, 2021 (13 pgs.).

* cited by examiner

SYSTEMS AND METHODS FOR CHROMATIC ABERRATION MITIGATION

CROSS-REFERENCE TO RELATED APPLICATIONS

This application claims priority to International Application No. PCT/EP2020/086594, filed Dec. 16, 2020, and published as WO 2021/122862 A1, which claims priority of EP application 19218291.3 which was filed on Dec. 19, 2019, and EP application 20195388.2 which was filed on Sep. 9, 2020. The contents of these applications are incorporated herein by reference in their entireties.

FIELD

The description herein relates to aberration mitigation or correction that may be useful in the field of charged particle beam systems, such as an electron microscopy apparatus utilizing one or more electron beams.

BACKGROUND

In manufacturing processes of integrated circuits (ICs), unfinished or finished circuit components may be inspected to ensure that they are manufactured according to design and are free of defects. Inspection may be done by a charged particle beam system that scans a primary beam across a sample and collects secondary particles generated from the sample at a detector. One example of a charged particle beam system is a scanning electron microscope (SEM). SEMs use beams of electrons because such beams can be used to see structures that are too small to be seen by optical microscopes, such as microscopes using visible light.

The use of SEMs in various applications such as photolithography increasingly requires low electron probing energies to minimize radiation damage and to mitigate charging effects. Extremely low landing energies may be required for SEM observations to allow the subsurface and nanoscale information of target specimens to be measured with minimized charge-up and minimized beam damage depths caused by reduced interaction volumes. As the probing energy is lowered, however, negative effects on imaging quality such as those due to chromatic aberration of a focusing lens may become more pronounced, thereby limiting the achievable spatial resolution. Factors contributing to chromatic aberration may include energy spread of a beam. Chromatic aberration may be reduced with a monochromator, but at the cost of reduced beam current.

Furthermore, some SEM systems may use multiple beams to improve throughput. But implementing a monochromator in a multi-beam system remains a challenge. Aberration correctors (such as multipole-lens correctors and mirror correctors) may be bulky and costly when applied to correct even one beam in a SEM. This may be compounded when attempting to integrate into a multi-beam system. Space limitations may complicate the integration of aberration correctors for every beamlet in a multi-beam system.

SUMMARY

Embodiments of the present disclosure provide systems and methods for imaging based on charged particle beams. In some embodiments, there may be provided a method of reducing aberration. The method may include separating a beam into beamlets based on energy of the beamlets, and deflecting the beamlets so that beamlets of different energy are deflected differently.

In some embodiments, there may be provided an aberration corrector. The aberration corrector may include a dispersive element configured to cause constituent parts of a beam to spread apart based on energy. The aberration corrector may include an aperture array configured to separate beamlets of the beam. The aperture array may include a deflector array configured to deflect the beamlets differently based on energy of the beamlets.

It is to be understood that both the foregoing general description and the following detailed description are exemplary and explanatory only and are not restrictive of the disclosed embodiments, as may be claimed.

BRIEF DESCRIPTION OF THE DRAWINGS

The above and other aspects of the present disclosure will become more apparent from the description of exemplary embodiments, taken in conjunction with the accompanying drawings.

DETAILED DESCRIPTION

Figure 1:
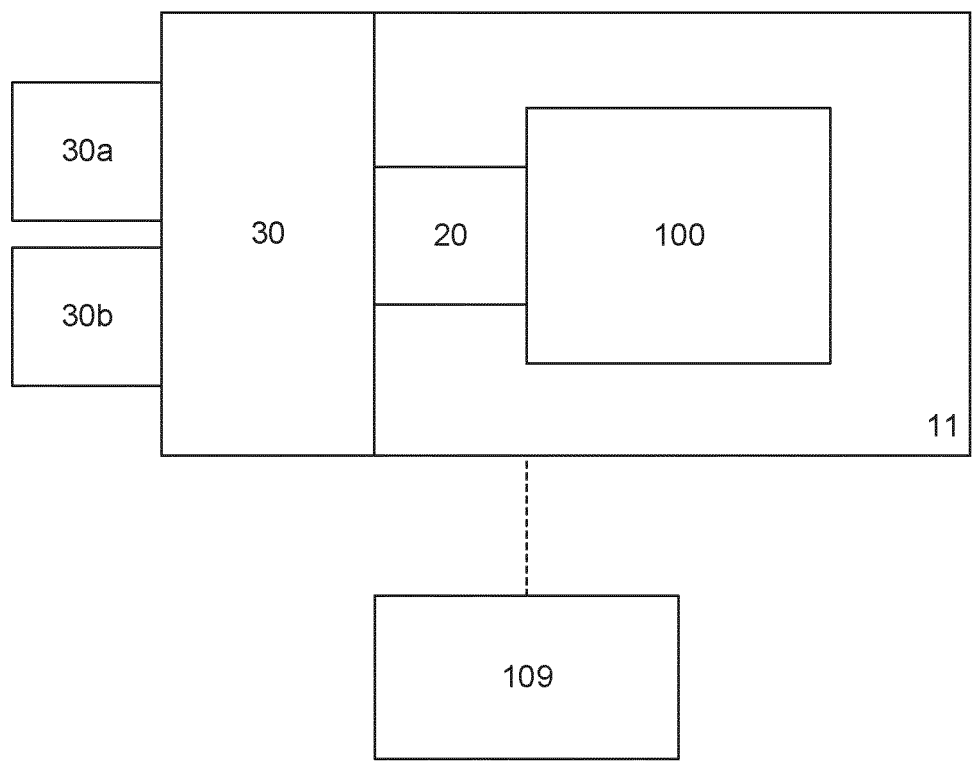
FIG. 1 is a schematic diagram illustrating an exemplary electron beam inspection (EBI) system, consistent with embodiments of the present disclosure.

Reference will now be made in detail to exemplary embodiments, examples of which are illustrated in the drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses, systems, and methods consistent with aspects related to subject matter that may be recited in the appended claims.

Electronic devices are constructed of circuits formed on a piece of silicon called a substrate. Many circuits may be formed together on the same piece of silicon and are called integrated circuits or ICs. With advancements in technology, the size of these circuits has decreased dramatically so that many more of them can fit on the substrate. For example, an IC chip in a smart phone can be as small as a thumbnail and yet may include over 2 billion transistors, the size of each transistor being less than 1/1,000th the size of a human hair.

Making these extremely small ICs is a complex, time-consuming, and expensive process, often involving hundreds of individual steps. Errors in even one step have the potential to result in defects in the finished IC, rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). A SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur.

An image of a wafer may be formed by scanning a primary beam of a SEM system over the wafer and collecting particles (e.g., secondary electrons) generated from the wafer surface at a detector. The process of imaging may include focusing the primary beam to a point, and deflecting (e.g., bending) the beam so that it passes over regions of the wafer in a line-by-line pattern (e.g., a raster scan). At a given time, the beam may be focused to a particular position on a wafer, and output of the detector at this time may be correlated to that particular position on the wafer. An image may be reconstructed based on detector output at each time along the beam scan path.

Factors that affect the quality of imaging (e.g., the quality of the picture produced by the SEM) include imaging resolution. The imaging resolution may depend on the ability of the beam to be focused to a point. As feature sizes on IC chips continues to decrease, e.g., to 5 nm and 3 nm node sizes, resolution becomes increasingly important. Resolution may be affected by various kinds of distortion or aberration that may be introduced in a SEM system. Aberration, such as field curvature aberration, astigmatism aberration, and chromatic aberration, may be caused when a beam travels through a lens.

At various stages of a SEM system, a beam may pass through lenses or other optical elements. For example, a lens may be used to focus the beam to a point on a sample. Some lenses may be used in a secondary imaging system to guide particles (e.g., secondary electrons) to the detector. Each time the beam passes through a lens, chromatic aberration may be introduced.

Chromatic aberration may refer to a phenomenon in which different parts of a beam having different energy travel through a lens and are refracted at different angles, resulting in an effect that the beam as a whole does not come to a single focal point. Different colors of visible light have different energy. In a visible light system, a lens may not focus all colors of a light beam to the same point due to chromatic aberration, which may result in blurriness or the appearance of rainbow edges in an image. In a visible light system, chromatic aberration may be observed in a prism. As light passes through a prism, different colors of light bend more or less than others, resulting in the different colors of the beam spreading out.

In a SEM system, chromatic aberration may be caused by optical elements such as deflectors or lenses. These structures may be made up of a magnetic lens or an electrostatic lens. A beam emitted from an electron source may be made up of electrons with varied energy. Electrons of differing energies may be distributed within the beam. The electrons may travel along the same direction (e.g., parallel to one another). As electrons of a beam enter a lens, the lens may direct electrons of different energy to different focal points. To address chromatic aberration, some systems may use a prism to spread out electrons of a beam according to their energy, and then use an aperture to filter out a portion of the beam, leaving only one beamlet (e.g., a smaller portion of a beam) that contains electrons that correspond to a target energy range. Such a device is called a monochromator. While a monochromator may reduce chromatic aberration, it results in the loss of electrons of the beam having different energy from the target energy range. This reduces beam current, which means that some energy of the beam is wasted.

Other methods to deal with chromatic aberration may include using multipole lenses to correct (e.g., compensate) for aberrations. However, some multipole lenses may be complicated and may place heavy demands on mechanical and electronic designs of a SEM system. For example, a multipole lens may require very precise alignment of many different parts. Furthermore, using multipole lenses in a SEM system may limit operation because multipole lenses may only be optimized for one particular energy level. Some applications may utilize beams at different energy levels, but this would be restricted when using multipole lenses.

To enhance performance of a SEM system, it would be desirable to correct for chromatic aberration without reducing beam current, and without inhibiting the operation flexibility of the SEM system. For example, it may be desirable to maintain a wide range of adjustability of parameters of a SEM system, such as primary beam energy, beam opening angle, and energy of secondary electrons arriving on a detector.

Embodiments of the disclosure may address issues such as those discussed above by reducing the effect of aberration, such as chromatic aberration. Chromatic aberration may be reduced without substantial energy loss and without compromising adjustability of operation parameters. An array of deflectors may be provided downstream of an optical element. A beam including charged particles, such as electrons, at different energy levels may enter the optical element, which may be a lens. The lens may cause electrons of differing energy contained in the beam to spread out based on their energy levels. The electrons within different energy ranges may be separated from one another, for example, by an aperture array. Beamlets may be formed from the aperture array. The beamlets may then pass through a component that influences the beamlets differently depending on their energy. For example, the beamlets may pass through the array of deflectors, and the deflectors may deflect beamlets differently based on the different energy levels of the electrons that comprise the beamlets. Beamlets deflected differently may be output from the deflectors with different angles. Then, the beamlets may enter another optical component, such a focusing lens, with different angles. If each beamlet is properly angled, the focusing lens may focus the beamlets to the same or substantially the same focal point.

In some embodiments of the disclosure, chromatic aberration may be reduced while more of the beam current may be utilized as compared to, for example, a monochromator. Furthermore, additional flexibility may be achieved. A beam may be divided into separate beamlets by an aperture array. Individual beamlets may be manipulated. An array of deflectors may be configured to deflect the beamlets differently. Some beamlets may be turned off by deflecting them away from downstream optical elements (e.g., toward an absorbing surface). For example, some applications may call for beamlets having electrons of a certain energy. In some embodiments, all of the beamlets may pass through the aperture array and be combined again. Thus, the beam may contain beamlets, where each of the beamlets is comprised of electrons at different energy levels, contributing to the beam's overall energy, while reducing chromatic aberration. Herein when a reference is made to a beam/beamlet of/with/ etc. a particular energy characteristic (e.g., a beam of/with/ etc. a central energy level), this means a beam or beamlet of particles where the particles that comprise the beam have the particular energy characteristic.

Furthermore, in some embodiments of the disclosure, beamlets may be further manipulated after being output from an aperture. For example, the pitch of beamlets may be adjusted using deflectors. The pitch may be adjusted so as to optimize interactions with downstream components. The pitch may be increased so as to make space for adding components, such as additional deflectors or lenses. Additionally, the energy of beamlets may be adjusted using electrostatic lenses. Beamlets formed from a prism and aperture may have different energy, and the energy of the beamlets may be adjusted so that some or all of the beamlets have the same energy when they reach a certain point (e.g., a sample surface). The beamlets may be directed to a sample so as to form a plurality of beam spots on the sample surface. The beamlets may be monochromatic.

Various configurations of an objective lens may be provided. Each beamlet may be provided with its own objective lens. Or, one or more beamlets may pass through one objective lens. A system with a single objective lens may allow for enhanced resolution. For example, a single objective lens may be provided that is configured to generate an immersion field. The immersion field may enable enhanced imaging resolution due to reduced aberration. On the other hand, a system using multiple objective lenses may have advantages such as being configured to use a large number of beamlets, and the beamlets may avoid a common crossover where electron-electron interactions (e.g., Coulomb effect) may adversely affect imaging resolution. For example, each beamlet may be configured to travel in a path that does not interfere with another.

Objects and advantages of the disclosure may be realized by the elements and combinations as set forth in the embodiments discussed herein. However, embodiments of the present disclosure are not necessarily required to achieve such exemplary objects or advantages, and some embodiments may not achieve any of the stated objects or advantages.

Without limiting the scope of the present disclosure, some embodiments may be described in the context of providing chromatic aberration mitigation systems and methods in systems utilizing electron beams ("e-beams"). However, the disclosure is not so limited. Other types of charged particle beams may be similarly applied. Furthermore, systems and methods for mitigating aberration or providing beamlets may be used in other imaging systems, such as optical imaging, photon detection, x-ray detection, ion detection, etc. Also, chromatic aberration mitigation or beamlet projection may be applicable in other systems, such as lithography systems. Additionally, the term "beamlet" may refer to a constituent part of a beam or a separate beam extracted from an original beam. The term "beam" may refer to beams or beamlets.

As used herein, unless specifically stated otherwise, the term "or" encompasses all possible combinations, except where infeasible. For example, if it is stated that a component includes A or B, then, unless specifically stated otherwise or infeasible, the component may include A, or B, or A and B. As a second example, if it is stated that a component includes A, B, or C, then, unless specifically stated otherwise or infeasible, the component may include A, or B, or C, or A and B, or A and C, or B and C, or A and B and C.

Reference is now made to FIG. 1, which illustrates an exemplary electron beam inspection (EBI) system 10 that may be used for detection, consistent with embodiments of the present disclosure. EBI system 10 may include a scanning electron microscope (SEM) and may be used for imaging. As shown in FIG. 1, EBI system 10 includes a main chamber 11 a load/lock chamber 20, an electron beam tool 100, and an equipment front end module (EFEM) 30. Electron beam tool 100 is located within main chamber 11. EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (wafers and samples may be collectively referred to as "wafers" herein).

One or more robotic arms (not shown) in EFEM 30 may transport the wafers to load/lock chamber 20. Load/lock chamber 20 is connected to a load/lock vacuum pump system (not shown) which removes gas molecules in load/ lock chamber 20 to reach a first pressure below the atmospheric pressure. After reaching the first pressure, one or more robotic arms (not shown) may transport the wafer from load/lock chamber 20 to main chamber 11. Main chamber 11 is connected to a main chamber vacuum pump system (not shown) which removes gas molecules in main chamber 11 to reach a second pressure below the first pressure. After reaching the second pressure, the wafer is subject to inspection by electron beam tool 100. Electron beam tool 100 may be a single-beam system or a multi-beam system. A controller 109 is electronically connected to electron beam tool 100, and may be electronically connected to other components as well. Controller 109 may be a computer configured to execute various controls of EBI system 10. While controller 109 is shown in FIG. 1 as being outside of the structure that includes main chamber 11, load/lock chamber 20, and EFEM 30, it is appreciated that controller 109 can be part of the structure.

A charged particle beam microscope, such as that formed by or which may be included in EBI system 10, may be capable of resolution down to, e.g., the nanometer scale, and may serve as a practical tool for inspecting IC components on wafers. With an e-beam system, electrons of a primary electron beam may be focused at probe spots on a wafer under inspection. The interactions of the primary electrons with the wafer may result in secondary particle beams being formed. The secondary particle beams may comprise backscattered electrons, secondary electrons, or Auger electrons, etc. resulting from the interactions of the primary electrons with the wafer. Characteristics of the secondary particle beams (e.g., intensity) may vary based on the properties of the internal or external structures of the wafer, and thus may indicate whether the wafer includes defects.

The intensity of the secondary particle beams may be determined using a detector. The secondary particle beams may form beam spots on a surface of the detector. The detector may generate electrical signals (e.g., a current, a voltage, etc.) that represent intensity of the detected secondary particle beams. The electrical signals may be measured with measurement circuitries which may include further components (e.g., analog-to-digital converters) to obtain a distribution of the detected electrons. The electron distribution data collected during a detection time window, in combination with corresponding scan path data of the primary electron beam incident on the wafer surface, may be used to reconstruct images of the wafer structures under inspection. The reconstructed images may be used to reveal various features of the internal or external structures of the wafer and may be used to reveal defects that may exist in the wafer.

Figure 2:
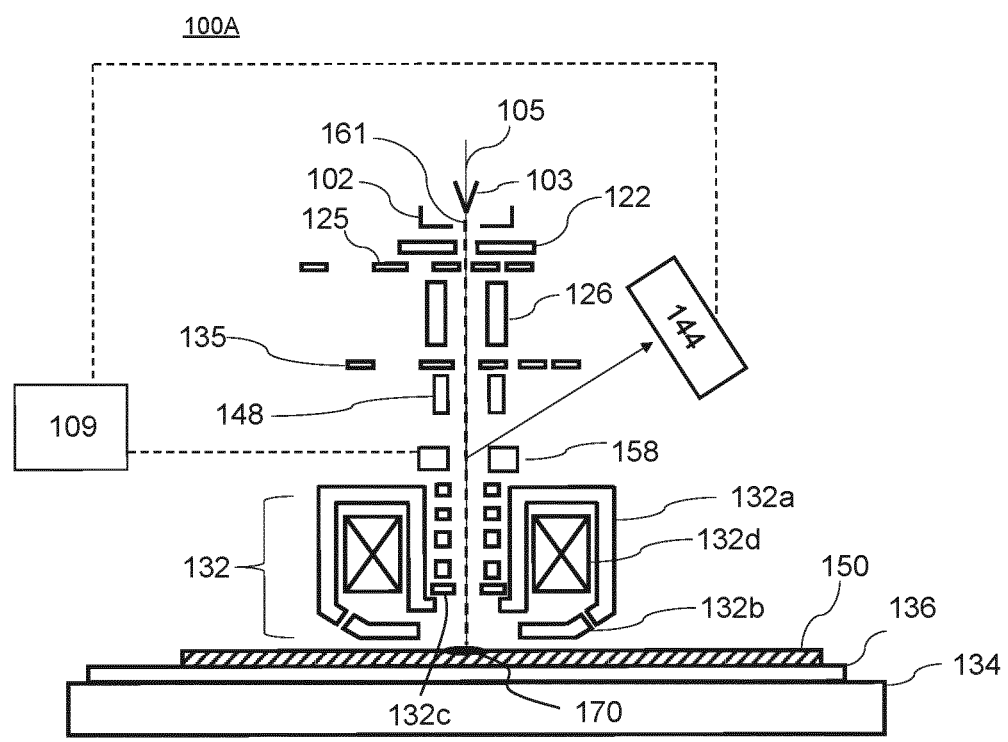
FIG. 2 is a diagram illustrating a charged particle beam apparatus that may be an example of an electron beam tool, consistent with embodiments of the present disclosure that may be a part of the exemplary electron beam inspection system of FIG. 1.

FIG. 2 illustrates a charged particle beam apparatus that may be an example of electron beam tool 100, consistent with embodiments of the present disclosure. Electron beam tool 100A (also referred to herein as apparatus 100A) may be a single-beam SEM tool that is used in EBI system 10. Apparatus 100A may include a primary beam source that includes an anode 102 and a cathode 103. A voltage may be applied between anode 102 and cathode 103 and a primary beam 161 may be emitted along an axis 105. Axis 105 may be the primary optical axis of the SEM.

Primary beam 161 may pass through a gun aperture 122 and a beam limit aperture 125. Beam limit aperture 125 may include an adjustable aperture plate. Gun aperture 122 and beam limit aperture 125 may determine the size of an electron beam entering a condenser lens 126. Condenser lens 126 may be provided below (e.g., downstream from) beam limit aperture 125. Condenser lens 126 may be configured to focus primary beam 161 before it enters a column aperture 135. Column aperture 135 may also include an adjustable aperture plate.

In some embodiments, apparatus 100A may include lens for manipulating primary beam 161. For example, a quadrupole lens 148 may be provided. Quadrupole lens 148 may include a plurality of lenses. For example, a first quadrupole lens may be provided and may be controlled to adjust beam current. A second quadrupole lens may be provided and may be controlled to adjust beam spot size and beam shape. In some embodiments, quadrupole lenses may be omitted.

Beam current of primary beam 161 may be determined by apertures, including gun aperture 122, beam limit aperture 125, and column aperture 135, and lenses, including condenser lens 126 and quadrupole lens 148.

As shown in FIG. 2, apparatus 100A may include a motorized stage 134 and a wafer holder 136 supported by motorized stage 134 to hold a wafer 150 to be inspected. Apparatus 100A further includes an objective lens assembly 132, a beam separator 158, and a detector 144. Objective lens assembly 132, in some embodiments, may include a modified swing objective retarding immersion lens (SORIL) that includes a pole piece 132a, a control electrode 132b, a deflector 132c, and an exciting coil 132d. Apparatus 100A may additionally include an energy dispersive X-ray spectrometer (EDS) detector (not shown) that may be used to characterize the materials on the wafer.

In operation, apparatus 100A may be used to inspect wafer 150 mounted on wafer holder 136. Primary beam 161 may travel through the SEM column of apparatus 100A. Deflector 132c may deflect primary beam 161 to scan across locations on a surface of wafer 150. In the objective lens assembly 132, exciting coil 132d and pole piece 132a may generate a magnetic field that begins at one end of pole piece 132a and terminates at the other end of pole piece 132a. Control electrode 132b may be electrically isolated from pole piece 132a and may control an electric field that affects beam focus. Primary beam 161 may be projected on wafer 150 and may form a beam spot 170.

Secondary particles, such as secondary electrons or backscattered electrons, may be emitted from the part of wafer 150 illuminated by primary beam 161 (e.g., at beam spot 170). Beam separator 158 may direct the secondary particles traveling back from wafer 150 to a sensor surface of detector 144. Beam separator 158 may change the direction of beams. Beam separator 158 may change the direction of beams selectively, for example based on velocity or energy of beams passing through beam separator 158. Beam separator 158 may be configured to change the direction of a beam of secondary particles directed back from wafer 150 toward beam separator 158 so that it is directed toward detector 144, while the trajectory of primary beam 161 is not altered as it passes through beam separator 158. For example, beam separator 158 may be aligned with axis 105 and may allow primary beam 161 to travel along axis 105 while a beam of secondary particles is diverted away from axis 105. In some embodiments, beam separator 158 may be configured to deflect primary beam 161 while beams of secondary particles are allowed to travel back from wafer 150 through beam separator 158 without having their trajectory changed. In some embodiments, beam separator 158 may be configured to deflect primary beam 161 and beams of secondary particles. Beam separator 158 may include a component that generates a magnetic field. Beam separator 158 may be connected to controller 109 and may be operated based on signals transmitted from controller 109.

Detector 144 may generate signals (e.g., voltages, currents, etc.) that represent the intensities of the received charged particles, and provide the signals to a processing system, such as controller 109. As shown in FIG. 2, detector 144 may be connected to controller 109. The intensity of a beam of secondary particles, and the resultant beam spot on detector 144, may vary according to the external or internal structure of wafer 150. Moreover, as discussed above, primary beam 161 may be projected onto different locations of the top surface of wafer 150 to generate beams of secondary particles (and resultant beam spots) of different intensities. Therefore, by mapping the intensities of the beam spots with the locations of wafer 150, the processing system may reconstruct an image that reflects the internal or external structures of wafer 150. Controller 109 may include an image processing system.

FIG. 2 may illustrate an apparatus that may be used in a low landing energy imaging system. The energy of the beam may be such that particles (e.g., electrons of a primary electron beam) do not penetrate completely through a sample. Rather, particles of the primary beam may interact with the sample surface, or penetrate only a short distance into the sample (e.g., a few nanometers). Low energy imaging may be useful to gather certain information about a sample, such as topographic, electronic, and chemical information. Some embodiments of the disclosure may be applicable to a low energy electron microscopy (LEEM) system, for example.

Figure 3:
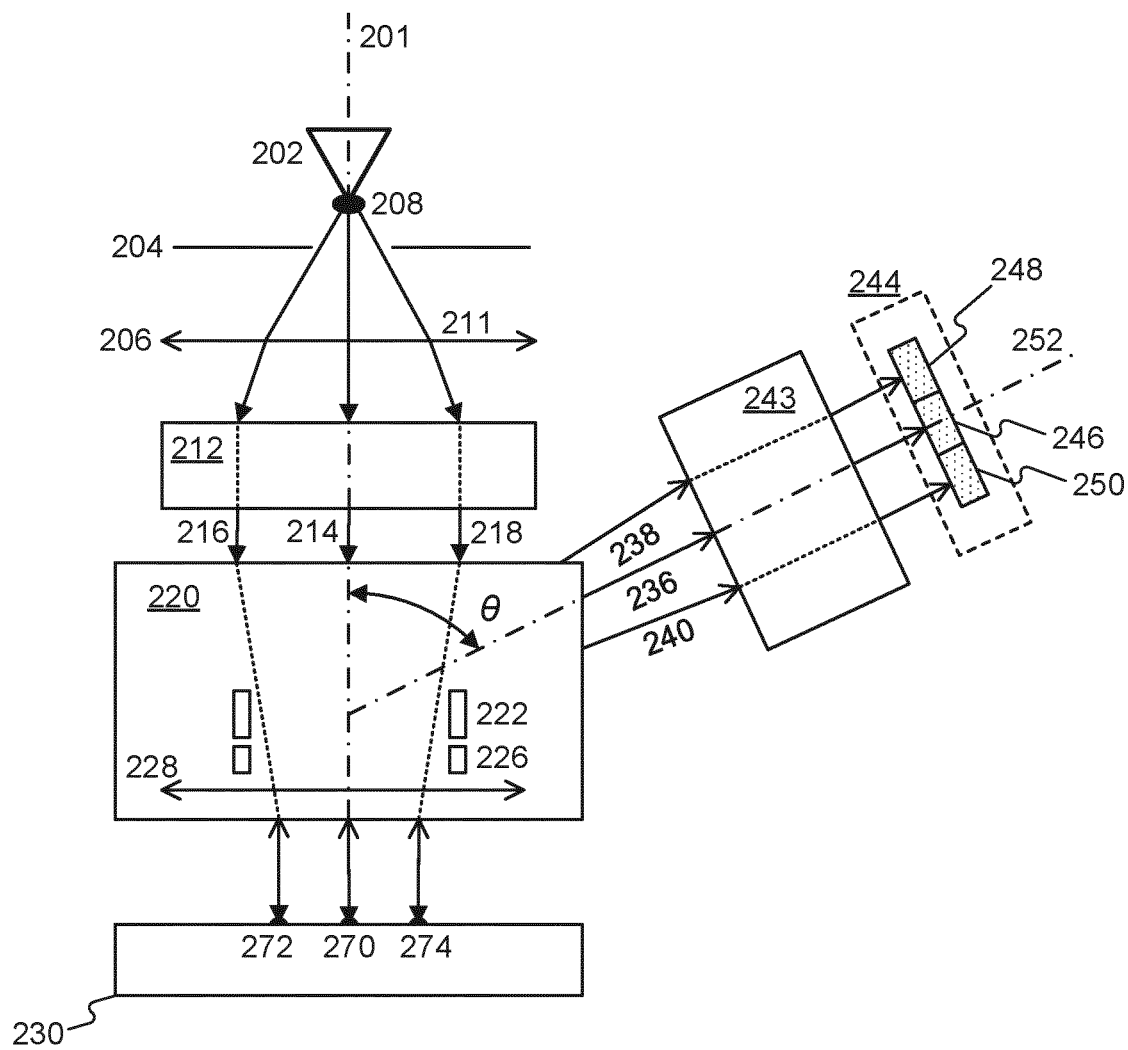
FIG. 3 is a diagram illustrating a multi-beam charged particle beam apparatus that may be an example of an electron beam tool, consistent with embodiments of the present disclosure that may be a part of the exemplary electron beam inspection system of FIG. 1.

FIG. 3 illustrates a charged particle beam apparatus that may be an example of electron beam tool 100, consistent with embodiments of the present disclosure. Electron beam tool 100B (also referred to herein as apparatus 100B) may be a multi-beam tool that is used in EBI system 10. Apparatus 100B may include an electron source 202. Electron source 202 may be configured to generate an electron beam along a primary optical axis 201.

As shown in FIG. 3, apparatus 100B may include electron source 202, a gun aperture 204, a condenser lens 206, a primary electron beam 211 emitted from electron source 202, a source conversion unit 212, a plurality of beamlets 214, 216, and 218 of primary electron beam 211, a primary projection optical system 220, a wafer stage (not shown in FIG. 3), multiple secondary electron beams 236, 238, and 240, a secondary optical system 243, and electron detection device 244. Electron source 202 may generate primary particles, such as electrons of primary electron beam 211. A controller, image processing system, and the like may be coupled to electron detection device 244. Primary projection optical system 220 may comprise beam separator 222, deflection scanning unit 226, and objective lens 228. Electron detection device 244 may comprise detection sub-regions 246, 248, and 250.

Electron source 202, gun aperture 204, condenser lens 206, source conversion unit 212, beam separator 222, deflection scanning unit 226, and objective lens 228 may be aligned with primary optical axis 201 of apparatus 100B. Secondary optical system 243 and electron detection device 244 may be aligned with a secondary optical axis 252 of apparatus 100B.

Electron source 202 may comprise a cathode, an extractor or an anode, wherein primary electrons can be emitted from the cathode and extracted or accelerated to form a primary electron beam 211 with a crossover (virtual or real) 208. Primary electron beam 211 can be visualized as being emitted from crossover 208. Gun aperture 204 may block off peripheral electrons of primary electron beam 211 to reduce size of probe spots 270, 272, and 274.

Source conversion unit 212 may comprise an array of image-forming elements (not shown in FIG. 3) and an array of beam-limit apertures (not shown in FIG. 3). An example of source conversion unit 212 may be found in U.S. Pat. No. 9,691,586; U.S. Publication No. 2017/0025243; and International Application No. PCT/EP2017/084429, all of which are incorporated by reference in their entireties. The array of image-forming elements may comprise an array of micro-deflectors or micro-lenses. The array of image-forming elements may form a plurality of parallel images (virtual or real) of crossover 208 with a plurality of beamlets 214, 216, and 218 of primary electron beam 211. The array of beam-limit apertures may limit the plurality of beamlets 214, 216, and 218.

Condenser lens 206 may focus primary electron beam 211. The electric currents of beamlets 214, 216, and 218 downstream of source conversion unit 212 may be varied by adjusting the focusing power of condenser lens 206 or by changing the radial sizes of the corresponding beam-limit apertures within the array of beam-limit apertures. Condenser lens 206 may be an adjustable condenser lens that may be configured so that the position of its first principle plane is movable. The adjustable condenser lens may be configured to be magnetic, which may result in off-axis beamlets 216 and 218 landing on the beamlet-limit apertures with rotation angles. The rotation angles change with the focusing power and the position of the first principal plane of the adjustable condenser lens. In some embodiments, the adjustable condenser lens may be an adjustable anti-rotation condenser lens, which involves an anti-rotation lens with a movable first principal plane. Examples of an adjustable condenser lens are further described in U.S. Publication No. 2017/0025241, which is incorporated by reference in its entirety.

Objective lens 228 may focus beamlets 214, 216, and 218 onto wafer 230 for inspection and may form a plurality of probe spots 270, 272, and 274 on the surface of wafer 230. Secondary electron beamlets 236, 238, and 240 may be formed that are emitted from wafer 230 and travel back toward beam separator 222.

Beam separator 222 may be a beam separator of Wien filter type generating an electrostatic dipole field and a magnetic dipole field. In some embodiments, the force exerted by electrostatic dipole field on an electron of beamlets 214, 216, and 218 may be equal in magnitude and opposite in direction to the force exerted on the electron by magnetic dipole field. Beamlets 214, 216, and 218 can therefore pass straight through beam separator 222 with zero deflection angle. However, the total dispersion of beamlets 214, 216, and 218 generated by beam separator 222 may also be non-zero. Beam separator 222 may separate secondary electron beams 236, 238, and 240 from beamlets 214, 216, and 218 and direct secondary electron beams 236, 238, and 240 towards secondary optical system 243. Beam separator 222 may direct beamlets toward secondary optical system 243 by deflecting them by an angle θ relative to primary optical axis 201.

Deflection scanning unit 226 may deflect beamlets 214, 216, and 218 to scan probe spots 270, 272, and 274 over an area on the surface of wafer 230. In response to incidence of beamlets 214, 216, and 218 at probe spots 270, 272, and 274, secondary electron beams 236, 238, and 240 may be emitted from wafer 230. Secondary electron beams 236, 238, and 240 may comprise electrons with a distribution of energies including secondary electrons and backscattered electrons. Secondary optical system 243 may focus secondary electron beams 236, 238, and 240 onto detection sub-regions 246, 248, and 250 of electron detection device 244. Detection sub-regions 246, 248, and 250 may be configured to detect corresponding secondary electron beams 236, 238, and 240 and generate corresponding signals used to reconstruct an image of the surface of wafer 230.

Figure 4:
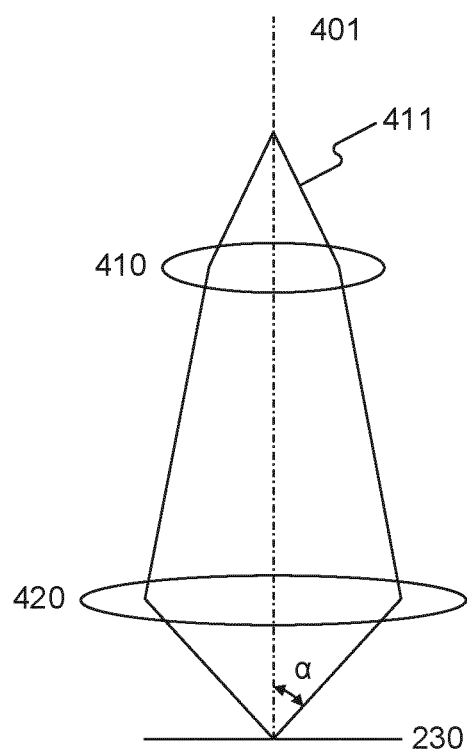
FIG. 4 illustrates a schematic of focusing of a beam, consistent with embodiments of the present disclosure.

Reference is now made to FIG. 4, which illustrates a schematic of focusing of a beam, consistent with embodiments of the present disclosure. In a SEM system, a beam may pass through lenses in order to shape and control the beam. Some lenses may cause a beam to expand (e.g., to become more of a diverging beam) or cause a beam to contract (e.g., to become more of a converging beam). Lenses may have a focusing power that corresponds to the strength of the lens and the extent to which a beam passing therethrough may be focused.

As shown in FIG. 4, a system may include a first lens 410 and a second lens 420 aligned with an optical axis 401. First lens 410 may be a condenser lens that may be placed downstream of a beam source. A beam emitted from a beam source may be a diverging beam, and first lens 410 may serve to at least partially focus the beam. Later downstream, second lens 420 may further focus the beam so as to make the beam a converging beam. Second lens 420 may be an objective lens that is configured to focus the beam to a point on a sample, such as wafer 230. As a beam passes through lenses in an optical system, the beam may experience chromatic aberration.

Figure 5:
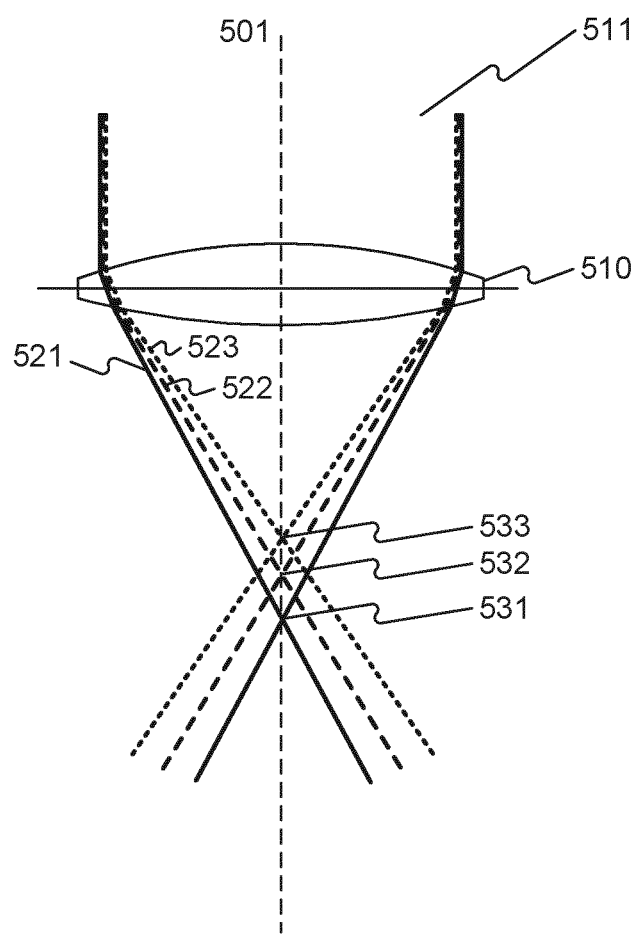
FIG. 5 illustrates an effect of chromatic aberration, consistent with embodiments of the present disclosure.

Reference is now made to FIG. 5, which illustrates an effect of chromatic aberration, consistent with embodiments of the present disclosure. As shown in FIG. 5, a beam 511 may travel along axis 501 and pass through a lens 510. Beam 511 may be a collimated beam. Beam 511 may include particles having different energy. Although "particles" of a beam are discussed herein, it will be understood that constituent parts or elements of a beam may not strictly behave like particles due to the particle-wave duality of light and other forms of radiation. Particles may include photons, electrons, ions, etc.

In some embodiments, groups of particles at similar energy levels included in a beam may be referred to as beamlets. Beamlets may overlap with one another at some parts of a beam and may separate from one another at other parts of a beam. For example, in a beam of visible white light, beamlets of red, orange, yellow, green, blue, indigo, and violet light may be contained in the beam but are not individually visible to the naked eye. However, when the beam undergoes dispersion, such as when passing through a prism, the beamlets separate and become individually visible.

As shown in FIG. 5, beam 511 may include beamlets comprising particles at different energies. Certain beamlets may correspond to certain energy ranges. In other words, certain beamlets may be comprised of particles that correspond to the certain energy ranges. As beam 511 passes through lens 510, beamlets may be focused differently. A beam passing through a lens may experience different focusing strength depending on its energy. For example, red light is less energetic than blue light and may be focused less than blue light passing through the same lens. The dependence of focusing power on beam energy may be a first-order phenomenon. For example, focusing power may be proportional to beam energy. This phenomenon may relate to chromatic aberration.

FIG. 5 shows that first beamlet 521 converges at a first focal point 531, second beamlet 522 converges at a second focal point 532, and third beamlet 523 converges at a third focal point 533. Focal points 531, 532, 533 may not be formed at the same location. Therefore, the overall focus of beam 511 may be degraded. This effect may be related to chromatic aberration.

Chromatic aberration in an optical system may be related to a chromatic aberration coefficient. Chromatic aberration may follow the following relationship:

$$d_c = 0.6 C_c \frac{\Delta E}{E} \alpha \qquad (1)$$

where $d_c$ is chromatic aberration, $C_c$ is chromatic aberration coefficient, E is landing energy, $\Delta E$ is energy spread, and $\alpha$ is beam opening angle. Chromatic aberration coefficient $C_c$ may be determined based on properties of an optical system. Landing energy E and energy spread $\Delta E$ may be determined based on properties on an input beam. Some parameters, such as beam opening angle $\alpha$, may be determined based on properties of both the optical system and the input beam. Some parameters may be based on measures of beam spot size according to a full width containing 50% of current (FW50).

As equation (1) demonstrates, chromatic aberration may be proportional to beam energy spread and chromatic aberration coefficient and may be inversely proportional to landing energy. Because chromatic aberration may increase with decreasing landing energy, the impact of chromatic aberration may become significant in cases of low landing energy. Chromatic aberration may heavily influence imaging quality in, for example, low landing energy imaging systems. In some low landing energy imaging systems, landing energy may be set to, for example, several 100s of eV, or below 100 eV. Values of $\Delta E$ may depend on electron emission types, such as thermal field emission, cold field emission, tungsten emission, etc. A typical value for $\Delta E$ for thermal field emission may be, for example, 0.5 eV.

In existing methods, there may be two main approaches to reducing chromatic aberration: 1) reducing chromatic aberration coefficient Cc; and 2) reducing energy spread $\Delta E$. Typically, reducing chromatic aberration coefficient involves making physical changes to a system. For example, an aberration corrector having multipole lenses may be installed in an imaging system. However, components using multipole lenses may be complicated and may place heavy demands on mechanical and electronic designs of an imaging system. For example, a multipole lens may require very precise alignment of many different parts. Furthermore, using multipole lenses may limit operation because such multipole lenses may only be optimized for one particular energy level. Using an aberration corrector may result in the loss of the ability to control parameters such as primary beam energy, beam opening angle, and energy of secondary particles arriving on a detector.

Reducing energy spread may be accomplished through a monochromator. However, a monochromator may filter out all but a small portion of a beam having energy within a certain range. The smaller the range (and thus, the lower the desired energy spread), the higher the loss of overall beam energy. Typical energy loss in a monochromator may be greater than 80% or 90%. This may result in lower throughput of an imaging system.

Figure 6:
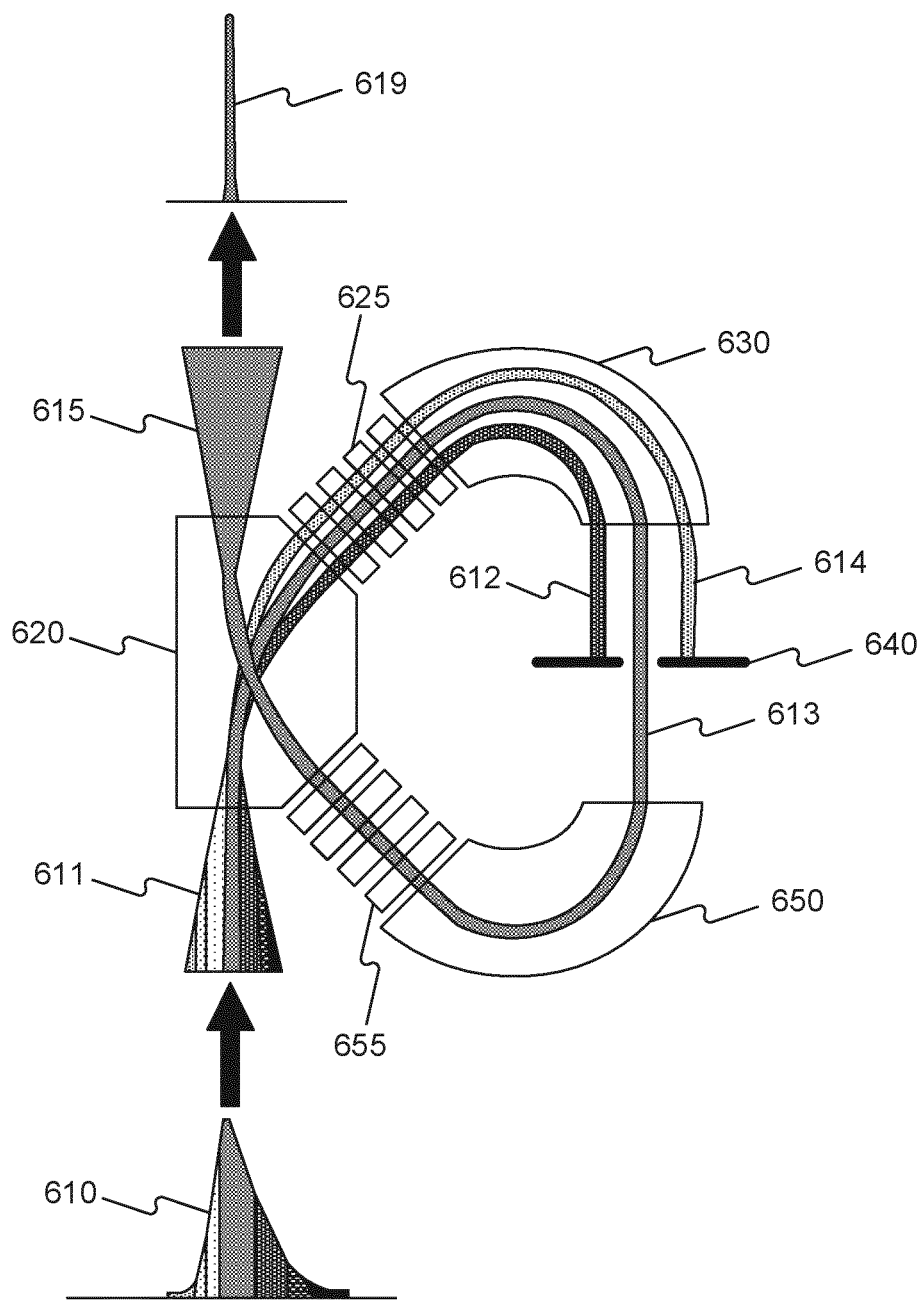
FIG. 6 illustrates a conventional monochromator.

Reference is now made to FIG. 6, which illustrates a conventional monochromator. A monochromator may break down light or other radiation into constituent components, and one of those components may be selected. For example, light may be dispersed into its constituent wavelengths. Monochromatic light of a single wavelength may be output from a monochromator. Monochromatic light may have little to no energy spread.

As shown in FIG. 6, there may be provided a first prism 620, first lenses 625, a second prism 630, an aperture 640, a third prism 650, and second lenses 655. An input beam 611 containing a plurality of constituent parts may be input into first prism 620. Input beam 611 may be represented by an initial energy spectrum 610. Upon exit from the monochromator of FIG. 6, an output beam 615 may be produced. Output beam 615 may consist of only one beamlet. Output beam 615 may be represented by a final energy spectrum

619. As shown in FIG. 6, only one constituent part of input beam 611 is selected, while others are filtered out. The selected constituent part may correspond to a certain energy range, such as an energy range that corresponds to a particular color of light. In other words, only one constituent part of input beam 611 that corresponds to a certain energy range may be extracted from input beam 611. For example, the selected constituent part may correspond to only green light.

In operation, first prism 620 may induce dispersion and cause constituent parts included in input beam 611 to spread out. The constituent parts may include beamlets. For example, first beamlet 612, second beamlet 613, and third beamlet 614 may become physically separated from one another. Beamlets 612, 613, 614 may be initially overlapped in input beam 611, but may become spaced apart from one another by some distance. After first exiting first prism 620, beamlets 612, 613, 614 may pass through lenses 625. Lenses 625 may cause beamlets 612, 613, 614 to travel in parallel with one another. Then, beamlets 612, 613, 614 may enter second prism 630. Second prism 630 may be a light guide that changes the trajectory of beamlets 612, 613, 614. Second prism 630 may induce further dispersion. Upon exiting from second prism 630, beamlets 612, 613, 614 may be directed toward aperture 640. Aperture 640 may include a variable slit. Aperture 640 may block all but one among beamlets 612, 613, 614 from passing through. Aperture 640 may be adjusted so as to select one beamlet. As shown in FIG. 6, aperture 640 allows only second beamlet 613 to pass through. Then, second beamlet 613 enters third prism 650. Third prism 650 may be a light guide similar to second prism 630. Upon exiting third prism 650, second beamlet 613 may pass through lenses 655. Lenses 655 may further shape and adjust a travel path of second beamlet 613. Beamlet 613 may enter first prism 620 again and may again experience dispersion. Upon being finally output from first prism 620, output beam 615 may be formed. Output beam 615 may be applied to a sample or used for some other purpose.

Although a prism is discussed herein and may be considered an analog in the context of a visible light system, it will be appreciated that a variety of dispersive elements may be used in an electron beam system or other systems. For example, a diffraction grating may be used as a dispersive element. Also, a component may generate a magnetic field that is used to separate electrons with different energy. A dispersive element in an electron beam system may include a component generating a magnetic field. An example of a component generating a magnetic field may include a magnetic lens. Although the term "lens" is used, a magnetic lens may be configured such that it does not impart a focusing effect on a beam passing through. A magnetic lens may be configured to generate a uniform field and may be used to alter the trajectory of a beam passing through it without focusing the beam.

Figure 7:
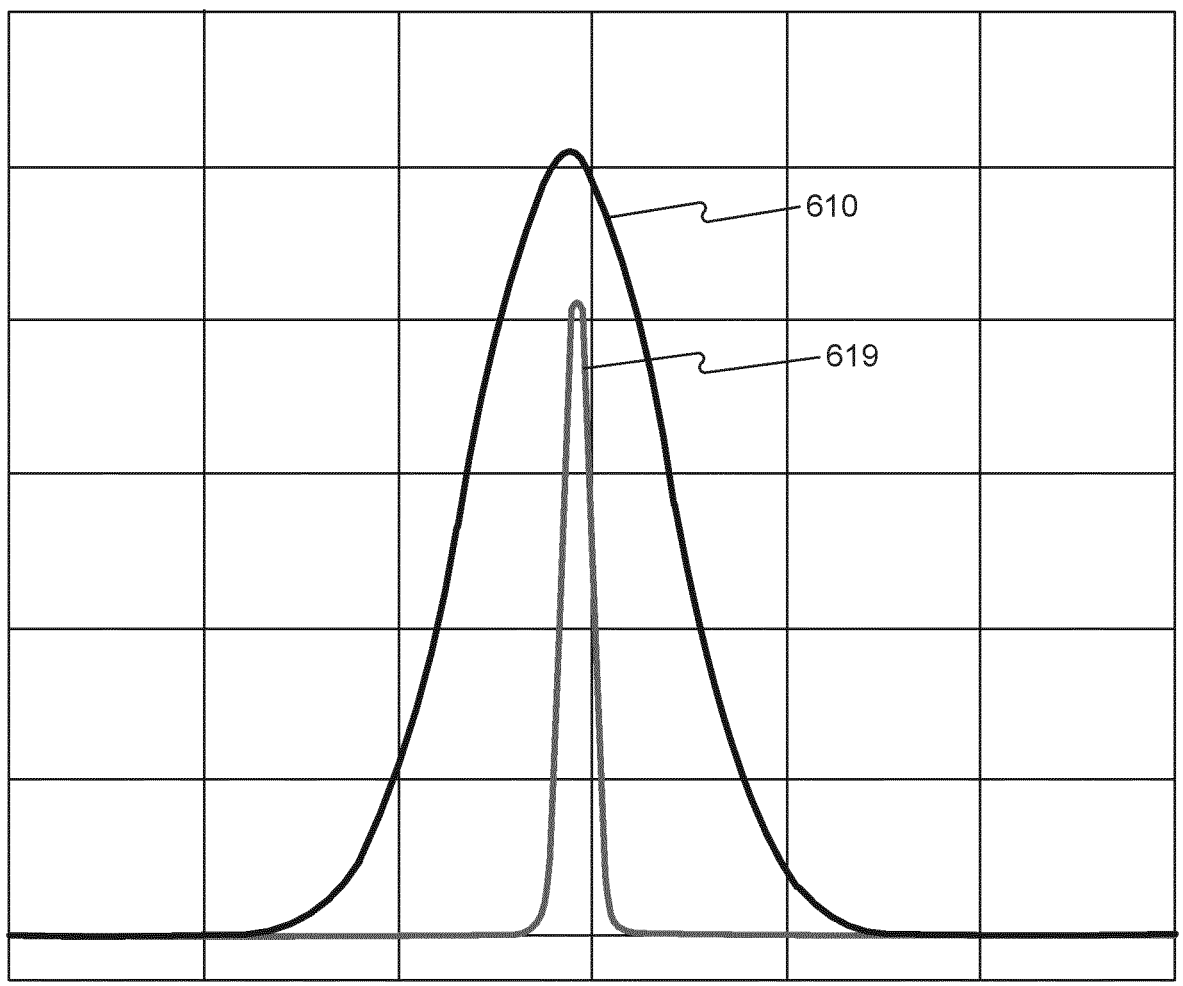
FIG. 7 illustrates a plot of energy distribution of beams that may correspond to beams shown in FIG. 6.

FIG. 7 shows a plot of energy distribution of beams that may correspond to beams shown in FIG. 6. The horizontal axis of FIG. 7 may represent beam energy deviation from a nominal value. The nominal value may be a central energy level. The vertical axis of FIG. 7 may represent energy distribution (e.g., dI/dE, where dI is the derivative of beam intensity and dE is the derivative of beam energy). As shown in FIG. 7, initial energy spectrum 610, which corresponds to input beam 611 (see FIG. 6), may be superimposed with final energy spectrum 619, which corresponds to output beam 615 (see FIG. 6). Final energy spectrum 619 has smaller deviation than initial energy spectrum 610, but at the expense of substantial loss of total energy of the beam. For example, total energy of final energy spectrum 619 may be 89% less than that of initial energy spectrum 610.

In some embodiments of the disclosure, energy spread of a beam may be reduced without sacrificing a substantial amount of energy of the beam. Furthermore, flexibility of a charged particle beam system may be enhanced. For example, beamlets of different energy levels in a beam may be preserved and used as desired. Furthermore, adjustability in operation parameters of a charged particle beam system, such as primary beam energy, beam opening angle, and energy of secondary electrons arriving on a detector, may be maintained Meanwhile, chromatic aberration may be reduced. Chromatic aberration coefficient of a system may be reduced. Focusing of beamlets may be further modified to compensate for field curvature effects, etc.

In some embodiments, a method of reducing chromatic aberration may include causing a beam to spread. Electrons within the beam that are at different energy levels may spread out away from one another. Beamlets may be formed from the beam. Beamlets may be formed by separating electrons of different energy from one another by, for example, passing the beam through an aperture array. Spreading the beam may involve separating electrons of the beam based on energy level. Separating electrons may involve inducing dispersion so that electrons that may eventually be included in different beamlets become physically spaced apart by some distance. Electrons may be caused to travel such that their trajectories are altered differently based on their energy, and electrons having different energies are directed toward different locations. Electrons of a particular energy level (e.g., a particular energy range) may be associated with a particular beamlet. Each beamlet may have its own axis. Beamlets may be shaped by cutting off some portions of the beam around their respective axes. Beamlets may be deflected toward another component such as a lens. An amount of beamlet deflection may be based on its energy. Beamlets may also be focused differently based on their energy. Amounts of deflection and focusing strength may be configured to reduce chromatic or field curvature aberration.

In some embodiments, spreading the beam may involve a sorting of electrons included in the beam. The beam may have a width, and particles at various energy levels may be dispersed within a cross sectional area of the beam. Particles at the same energy level may not necessarily be close to one another in the initial beam. Sorting of electrons may involve influencing trajectories of the electrons such that particles of different energy become further apart from one another and particles of similar energy become closer to one another. Particles in a beam may traverse substantially the same path (e.g., because they are included in one beam that generally has a principal travel direction), but may experience dispersion such that the beam becomes a spread beam.

In some embodiments, an aberration corrector may be provided that includes a dispersive element. The dispersive element may be configured to spread a beam. The dispersive element may be configured to cause electrons within the beam at different energy levels to spread out away from one another. Beamlets of a beam may be separated from one another based on energy level. Beamlets may have their trajectories altered such that beamlets having different energies are directed toward different locations. The beamlets may be shaped by passing them through an aperture array. Output of the aperture array may include a predetermined number of beamlets having a defined shape. The beamlets may have an energy spread that is lower than an initial beam. Beamlets may pass through a deflector array that is configured to deflect the beamlets differently based on their energy. The deflector array may be configured to reduce chromatic aberration. A lens array may also be provided. The lens array may be configured to reduce field curvature aberration. Beamlets may be directed toward another optical component, such as a lens, with angles such that aberration of an image produced by the lens is reduced. For example, beamlets may enter a lens with particular angles such that the beamlets converge at a common focal point downstream from the lens.

An electron beam apparatus may be provided with an aberration corrector. The aberration corrector may include a dispersive element that is configured to generate a magnetic field. The magnetic field may separate electrons with different energies. The aberration corrector may include an aperture array. The aperture array may be used to form separate beamlets each with small energy spread. An array of micro lenses and micro deflectors may be included in the aberration corrector. The array may direct beamlets in a way such that chromatic aberration is reduced.

Figure 8:
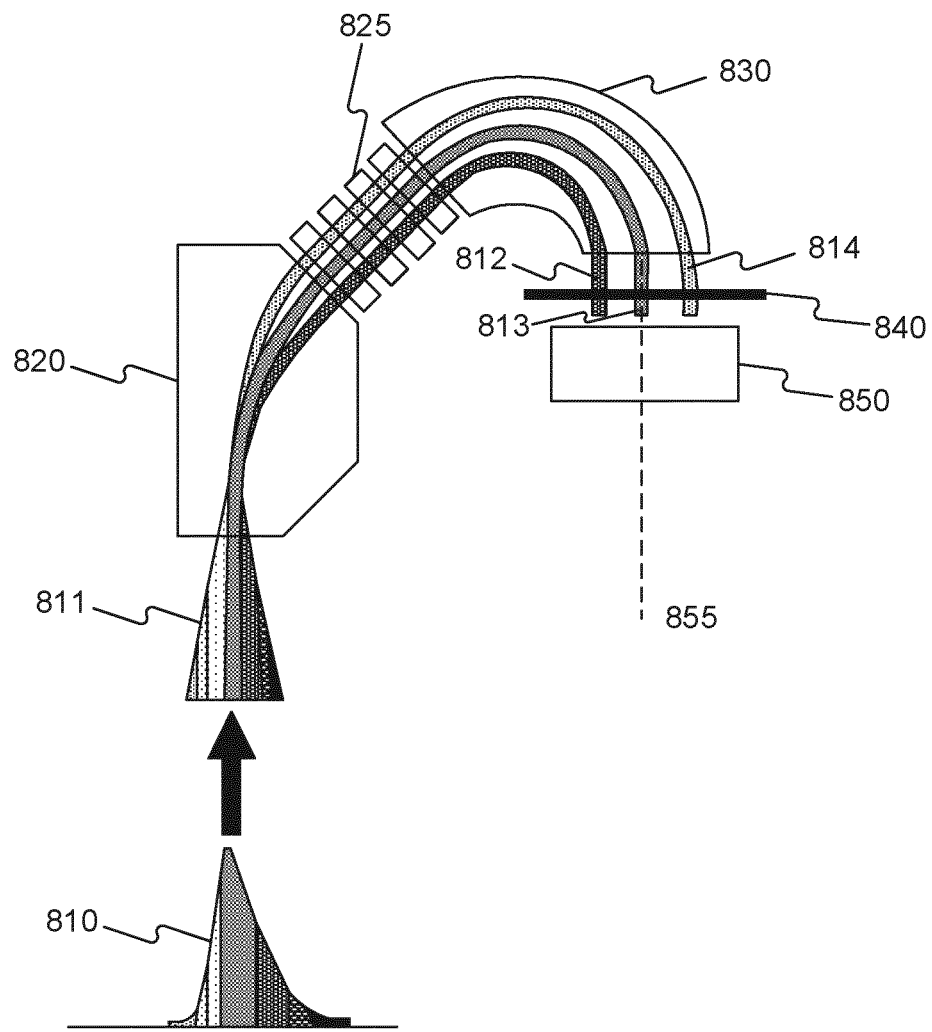
FIG. 8 illustrates an aberration corrector, consistent with embodiments of the present disclosure.

Reference is now made to FIG. 8, which illustrates an aberration corrector, consistent with embodiments of the disclosure. As shown in FIG. 8, there may be provided a first prism 820. First prism 820 may include a dispersive element. The dispersive element may be configured to generate a magnetic field. The dispersive element may induce dispersion that causes electrons of different energies passing through the dispersive element to be deflected differently. The dispersive element may output a beam that is spread out such that electrons of different energies are further apart than electrons of similar energies. Electrons of different energies may be caused to be spaced apart from one another in a direction perpendicular to a principal travel direction of the beam.

An input beam 811 may be input to first prism 820. Input beam 811 may have an energy spectrum 810. Input beam 811 may be caused to spread by first prism 820. Input beam 811 may undergo dispersion and may be output to lenses 825. Lenses 825 may control a trajectory or convergence of beams traveling therethrough. For example, lenses 825 may cause beams traveling therethrough to travel parallel to an axis of lenses 825 and to be collimated. Lenses 825 may direct beams toward a second prism 830. Second prism 830 may be configured to change a direction of beams passing therethrough. Second prism 830 may also induce further dispersion to beams passing therethrough. Constituent parts of input beam 811 may be spread apart. Constituent parts of input beam 811 may include electrons within a certain energy range. The energy range may include a central energy level. Electrons of an energy range may be associated with a beamlet. Beamlets 812, 813, and 814 may be output from second prism 830. Beamlets 812, 813, and 814 may be included in input beam 811. Upon exiting second prism 830, beamlets 812, 813, and 814 may be spaced apart from one another by some distance. Beamlets 812, 813, and 814 may be traveling parallel to one another.

As shown in FIG. 8, an aperture array 840 may be provided. Aperture array 840 may include a plate with a plurality of holes formed therein. Beamlets 812, 813, and 814, having been spread apart due to dispersion according to their respective energy levels, may be projected onto different locations of aperture array 840. Separate beamlets output from aperture array 840 may be beamlets that have different energies from one another. For example, electrons associated with a respective beamlet may be of an energy range that is different from electrons of other beamlets. Aperture array 840 may trim electrons at the periphery of beamlets passing therethrough such that beamlets are emitted with a well-defined shape. In some embodiments, a beam may experience such dispersion that beamlets are completely separated out and are input into holes of aperture array 840 without contacting the plate. Thus, aperture array 840 may be configured so as to not cut off any portion of an input beam, in some embodiments. Aperture array 840 may be configured to generate a plurality of beamlets with reduced energy spread relative to an input beam. For example, each of beamlets 812, 813, and 814 may have energy spread that is less than that of input beam 811. Beamlets 812, 813, and 814 may be directed to another component, such as optical element 850. Optical element 850 may include a lens. Optical element 850 may include an array of lenses or an array of deflectors. In some embodiments, optical element 850 may include separate lenses or deflectors that are provided for respective beamlets.

Figure 9A:
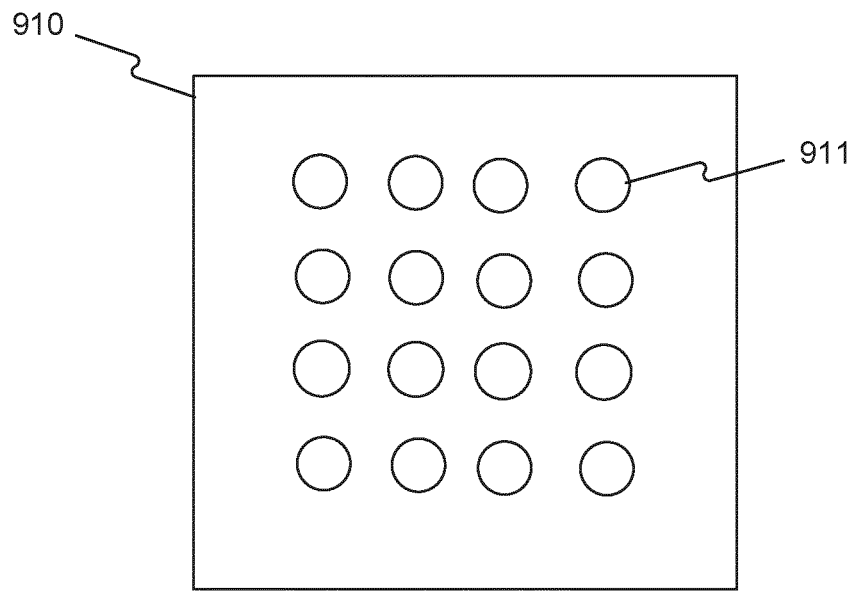
FIG. 9A and FIG. 9B illustrates examples of structures that may form an aperture array, consistent with embodiments of the present disclosure.
Figure 9B:
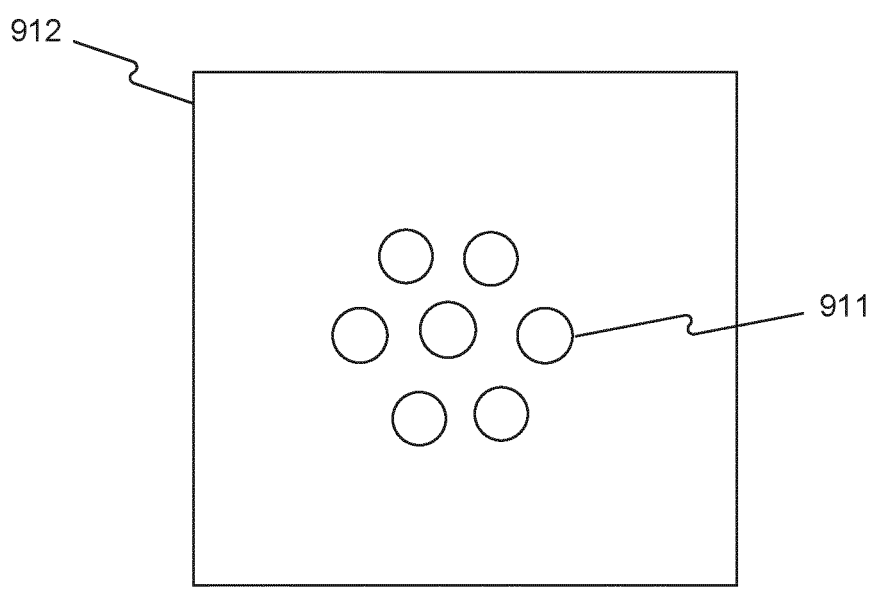

FIG. 9A and FIG. 9B show examples of structures that may form aperture array 840, consistent with embodiments of the disclosure. As shown in FIG. 9A, an aperture plate 910 may be provided. Aperture plate 910 may include a plurality of openings 911. Openings 911 may be arranged in a regular repeating pattern. The interval between openings 911 may be constant. In some embodiments, openings 911 may be arranged in an irregular pattern. Arrangement of openings 911 may be based on expected dispersion induced by a dispersive element, such as prism 820 or prism 830. For example, openings 911 may be provided at a predetermined interval based on a distance from and a dispersion strength of a dispersive element, such as prism 820.

Openings in an aperture plate may be formed in a variety of patterns. For example, FIG. 9B shows an aperture plate 912 having openings 911 formed in a hexagonal pattern. An arrangement of openings 911 may be configured to conform to an overall shape of a beam. For example, it may be expected that a beam forms an overall circular cross-sectional shape. The beam may experience dispersion from a dispersive element such that the beam becomes broadened, but the overall shape may remain substantially circular. Thus, a hexagonal pattern of openings 911 may more closely conform to the overall shape of the beam. Openings 911 may be circular, elliptical, slit-like, or polygonal, for example The size and shape of openings 911, and the arrangement of openings 911 in an aperture plate may be adjusted according to desired properties of beamlets.

Referring back to FIG. 8, aperture array 840 may be configured to output beamlets, each beamlet having a central energy level and a range of energies of particles included in the beamlet. The range of energies may correspond to the shape or size of openings 911. For example, a beamlet may travel through an opening such that most particles are around its central energy level and travel near the center of the opening. Particles at energies near the periphery of the range may be cut off by edges of the aperture. The edge of opening 911 may define the boundaries of the range of energies of particles permitted to pass through aperture array 840 in a beamlet.

Beamlets emitted from aperture array 840 may each have an energy spread that is less than beams upstream from aperture array 840. Energy spread of beamlets 812, 813, and 814 may be less than that of input beam 811. In some embodiments, a thermal field emission gun may be used as a beam source. A beam may be generated that has initial energy spread of about 0.7 eV. When such a beam is used as input beam 811, energy spread of individual beamlets 812, 813, and 814 may be about 0.1 eV, for example, when passed through aperture array 840.

In some embodiments, aperture array 840 may include shutters. Individual openings 911 in an aperture plate may be manipulated by opening or closing a shutter. Alternatively, a blanker may be used. A blanker may be used to divert a path of a charged particle beam away from its input axis such that the beam does not continue to pass through the system. Beams may be diverted to an absorbing surface. In some embodiments, it may be desirable to block one or more beamlets. The effects of those beamlets may be filtered out. The ability to allow individual beamlets of differing energy levels to be turned on or off may enhance flexibility of a charged particle beam system.

Figure 10A:
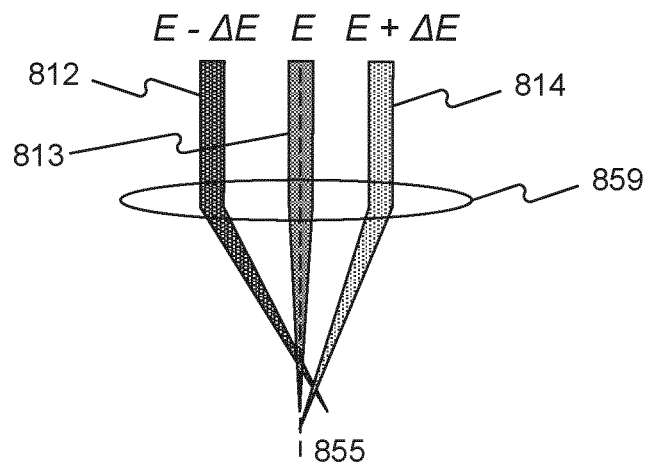
FIGS. 10A-10C illustrate corrections of aberration by a deflector or lens array, consistent with embodiments of the disclosure.
Figure 10B:
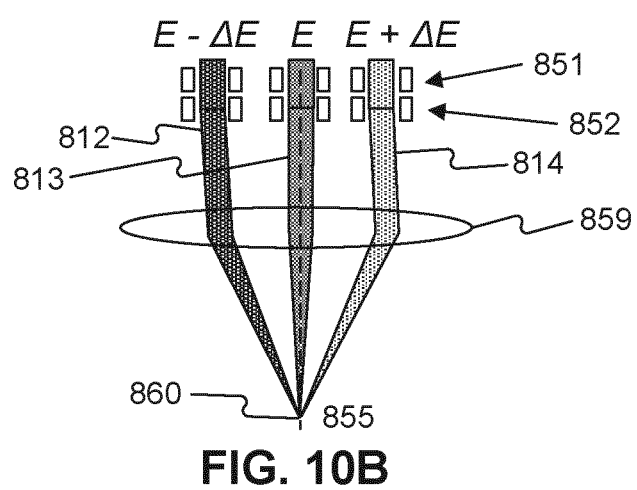
Figure 10C:
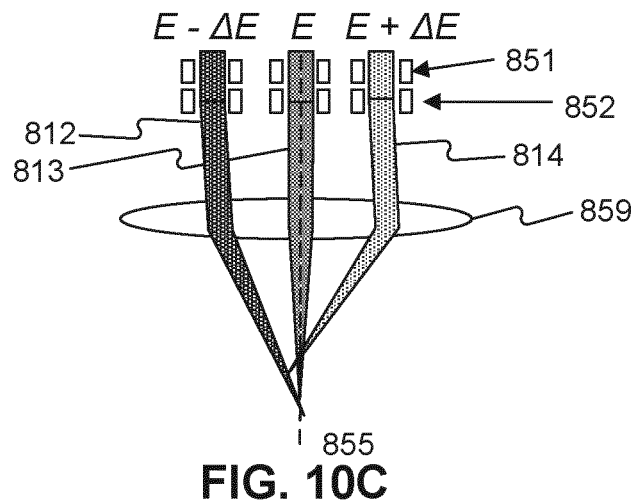

Reference is now made to FIGS. 10A-10C, which illustrate corrections of aberration by a deflector or lens array, consistent with embodiments of the disclosure. Beamlets 812, 813, and 814 may be directed toward a lens 859. Lens 859 may be included in optical element 850. Lens 859 may be aligned with axis 855 (see also FIG. 8). Beamlets 812, 813, and 814 output from aperture array 840 may each be at different energy levels from one another. Input beam 811 may have an energy spread of $\Delta E$, and this may represent a difference from a central nominal energy level (E) of beam 811 to a peripheral energy level. Energies of beamlets within beam 811 may range from $E-\Delta E$ to $E+\Delta E$. As shown in FIG. 10A, beamlet 812 may have energy of $E-\Delta E$, beamlet 813 may have energy of E, and beamlet 814 may have energy of $E+\Delta E$. Prisms 820 and 830, and aperture array 840 may be configured to extract beamlet 812 that may represent a least energetic beamlet among beam 811, and beamlet 814 that may represent a most energetic beamlet among beam 811. Because beamlets 812, 813, and 814 may be at different energy levels, they may experience different focusing power as they travel through lens 859. For example, a beamlet with higher energy may experience weaker focusing effect while a beamlet with lower energy experiences stronger focusing effect. This may result in chromatic aberration. Furthermore, because beamlets 812, 813, and 814 may be spaced apart from one another, they may experience different focusing power by virtue of entering lens 859 at different locations (e.g., at different radial positions of lens 859 relative to a central axis). For example, off-axis beamlets may experience stronger focusing effect than an axial ("on-axis") beamlet. This may result in field curvature aberration. As shown in FIG. 10A, beamlets 812, 813, and 814 may form focal points at different locations. This may cause the overall focus of beam 811 to be degraded as the multiple beamlets do not converge at the same location. A resulting beam spot may be broadened accordingly.

FIG. 10B shows a lens array 851 and a deflector array 852. Lens array 851 and deflector array 852 may be included in optical element 850. Lens array 851 and deflector array 852 may be formed by micro electromechanical system (MEMS) devices. Lens array 851 may include a plurality of micro lenses, each of the micro lenses configured to surround a respective beamlet. Deflector array 852 may include a plurality of micro deflectors, each of the micro deflectors configured to surround a respective beamlet. Micro lenses and micro deflectors of lens array 851 and deflector array 852 may be aligned with respective openings 911 of aperture array 840.

Lens array 851 or deflector array 852 may be controlled by a driver. The driver may be configured to apply a voltage to an electrostatic lens that may be included in a micro lens, or to apply excitation to an electrode that may be included in a micro deflector, for example Controller 109 may be configured to control the driver (see FIG. 1).

Lens array 851 and deflector array 852 may be controlled so as to compensate for aberration. Lens array 851 and deflector array 852 may change angles and positions of beamlets entering lens 859. Lens array 851 and deflector array 852 may cause beamlets 812, 813, and 814 to be focused together. As shown in FIG. 10B, beamlets 812, 813, and 814 may be brought to a common focal point 860. Focal point 860 may be formed on a surface of a sample. In some embodiments, beamlets 812, 813, and 814 may pass on to another optical element. Focal point 860 may be formed at the other optical element. Stated another way, beamlets 812, 813, and 814 may be focused such that their image planes converge. That is, the image plane of beamlet 812, that of beamlet 813, and that of beamlet 814 may be the same.

Deflector array 852 may be configured to deflect beamlets 812, 813, and 814 differently. The deflection imparted to beamlets passing through deflector array 852 may differ based on the energy levels of the respective beamlets. Beamlets may be divided according to their energy levels. For example, aperture array 840 may output separate beamlets each having different energy. The energy of each beamlet may be known based on its location in aperture array 840. For example, individual apertures of aperture array 840 may each correspond to a target energy range. Beamlets output from aperture array 840 may be input to deflector array 852. Thus, each of the beamlets input to deflector array 852 may have a known energy. Differences in deflection imparted by deflector array 852 may be determined based on geometry of deflector array 852. Deflectors of deflector array 852 further from a central axis may be configured to deflect beamlets more. For example, deflectors of deflector array 852 further from axis 855 may be configured to deflect beamlets passing therethrough more than deflectors that are closer to or aligned with axis 855.

Deflector array 852 may be configured to reduce chromatic aberration. Chromatic aberration may be a first order phenomenon. For example, as shown in equation (1), chromatic aberration may be proportional to beam energy spread and chromatic aberration coefficient, and may be inversely proportional to landing energy. As any one variable (e.g., beam energy spread, chromatic aberration coefficient, or landing energy) is varied, chromatic aberration may change in proportion.

Chromatic aberration may be counteracted by deflection imparted by deflector array 852. The effect of imparting deflection on a beam by a deflector may also be a first order phenomenon. For example, a deflector may be actuated by applying an electrical signal (e.g., voltage, current) from a driver to an electrode of the deflector. Deflection may be imparted to a beam passing through the deflector that is in proportion to the electrical signal of the driver. Using a first-order effect, such as deflection to counteract chromatic aberration, which may also be a first-order effect, may enable chromatic aberration to be compensated for predictably and accurately.

In an optical system, various kinds of aberration may be present, such as chromatic, spherical, astigmatic, and field curvature aberration. Arrangements of deflectors or lenses may be useful to address aberration. A deflector may have a multi-pole structure. By applying a distribution of electrical potential to the poles, the multi-pole structure may be used as a deflector. Using a deflector, such as deflector array 852, to correct chromatic aberration may be effective to enhance the focus of a beam. Furthermore, by applying a different potential distribution, the multi-pole structure may be used to reduce or eliminate astigmatism. For example, the multi-pole structure may change the beam profile of beamlets passing through deflector array 852 so as to compensate for astigmatism. Thus, deflector array 852 may also be effective to reduce or eliminate astigmatism in addition to deflecting beamlets to correct chromatic aberration. Deflection and stigmator functions may be combined in one multi-pole structure. To further enhance the focus of the beam, other kinds of aberration may be corrected. For example, lens array 851 may be configured to correct field curvature aberration.

Separating a beam into beamlets that are physically spaced apart from one another may give rise to an effect based on the separation of the beamlets. Some beamlets may experience optical effects that are different from adjacent beamlets. For example, as shown in FIG. 8, beamlets may be directed to optical element 850 downstream of aperture array 840 along an axis 855. Optical element 850 may include a focusing lens. The beamlets may enter optical element 850 at different radial locations relative to axis 855. For example, when optical element 850 includes a focusing lens, some beamlets entering optical element 850 further away from axis 855 may experience a focusing effect different from beamlets closer to axis 855. This may introduce field curvature aberration. To address field curvature aberration, it may be effective to add lenses that correspond to individual beamlets. As shown in FIG. 10B, lens array 851 may be provided. Lenses of lens array 851 may be positioned near each deflector of deflector array 852. Lens array 851 may be configured to reduce field curvature aberration.

Lens array 851 may be configured to reduce field curvature aberration based on a parameter related to separation of beamlets. Lens array 851 may be configured to focus beamlets differently based on an amount of offset (e.g., a distance from a central axis aligned with a downstream optical component). The central axis may be aligned with the center of a downstream focusing lens (e.g., axis 855 of optical element 850 as shown in FIG. 8). The magnitude of field curvature aberration effect on a beamlet may be related to the square of the distance of the beamlet from the central axis. An off-axis beamlet may experience stronger focusing effect as it passes through a focusing lens than an axial beamlet. Without compensating for field curvature aberration, in the image plane of the axial beamlet, the off-axis beamlet may not be in its optimal focused condition. Thus, a spot size at the image plane may become larger. Field curvature aberration may refer to this effect. In some embodiments, lens array 851 may be configured to reduce field curvature aberration. Lenses of lens array 851 may be configured to impart extra focusing strength to cause image planes of axial and off-axis beamlets to converge. This may reduce or compensate for field curvature aberration.

In some embodiments, lenses of lens array 851 may be provided at an interval similar to openings (e.g., openings 911 of FIG. 9) of an aperture array (e.g., aperture array 840), and distances of lenses from a central axis may be predetermined. Each lens may be configured to impart a focusing power based on a factor related to distance from a central axis. For example, each lens may be configured to impart a focusing power proportional to the square of its distance from a central axis. Also, although FIG. 10B shows a lens and deflector provided for each beamlet, it will be appreciated that some components may be omitted. For example, when beamlet 813 is aligned with a central axis, it may not be necessary to provide a lens or deflector. Beamlet 813 may be allowed to travel straight through aperture array 840 without having its trajectory altered prior to entering optical element 850. Although beamlet 813 may not need a deflector, it may still use a lens for field curvature correction. For example, a SEM may use a focusing lens rather than a defocusing lens. Off-axis beamlets entering the lens may be focused more strongly than an on-axis ("axial") beamlet. Extra focusing may be applied to the on-axis beamlet, relative to the off-axis beamlets, to compensate for focusing differences.

In some embodiments, field curvature aberration may be corrected by devices or means other than lens array 851. For example, in an optical system, an aspherical lens may be provided. In some embodiments, lens 859 may include an aspherical lens. In some embodiments, lens 859 may be configured as a magnetic or electrostatic lens that generates a field asymmetrically (e.g., not uniform). For example, a magnetic field may be shaped by pole pieces, etc. A magnetic lens may be configured to generate a magnetic field that has different intensity based on the distance from a central axis of the lens. Whereas, an electric field may be shaped by electrodes, etc. An electrostatic lens may be configured to generate an electric field that has different intensity based on distance from a central axis of the lens. Furthermore, in some embodiments, when field curvature is relatively small, there may be little or no need to correct it.

FIG. 10C shows deflection of beamlets in a manner so that a common focal point is not formed directly downstream of deflector array 852. For example, beamlets may be deflected in a manner so as to overcompensate for aberration. An electron optical system may be configured to have a negative chromatic aberration coefficient Cc. In some embodiments, negative chromatic aberration effects may be generated. Negative chromatic aberration effects may be useful in situations where more than one lens is provided following deflector array 852. Deflector array 852 may be configured to generate negative chromatic aberration effect so as to form a common focal point of beamlets downstream of a plurality of lenses. Parameters of some optical components, such as lenses, may be known in advance, and deflector array 852 may be configured to compensate for them.

Deflector array 852 may be provided downstream from lens array 851. After beamlets with small energy spread are generated, they may pass through lens array 851 and then deflector array 852. The axis of each lens of lens array 851 may coincide with the axis of each beamlet. Thus, lens array 851 may be enabled to compensate for field curvature aberration. Then, deflectors of deflector array 852 may impart certain deflection angles to each beamlet. Because deflection imparted by the deflectors may vary, it may be beneficial to provide lens array 851 upstream from deflector array 852. Lens array 851 may include a static array of lenses.

In some embodiments, it may be desirable to maintain all beamlets of a beam for use in a charged particle beam system. Beamlets of varying energy may have various uses. Flexibility of a charged particle beam system may be enhanced by enabling all beamlets of a beam to be used. Systems and methods for aberration mitigation may enable aberration to be reduced while allowing beamlets of various energy levels to be maintained In some embodiments, individual beamlets may be manipulated. According to an application, it may be useful to apply one or more of the beamlets to a sample or other component, and to turn off one or more other beamlets, for example. Furthermore, an energy spread distribution may be altered depending on which beamlets are configured to pass through a charged particle beam system. Systems and methods for aberration mitigation may allow a broad range of selection among various beamlets.

In some embodiments, systems and methods for aberration mitigation may be applied at various locations in a charged particle beam system. Some optical components in a charged particle beam system may be configured to alter the trajectory of a beam passing through. For example, with reference to FIG. 2, beam separator 158 may be configured to direct an input beam (e.g., primary beam 161) toward wafer 150 and to direct a reflected beam toward detector 144. With changes of direction, beam separator 158 may deflect beams passing therethrough differently according to their energy, and chromatic aberration may result. As another example, with reference to FIG. 3, beam separator 222 may include a Wien filter that is configured to deflect particles of a beam passing therethrough differently according to their velocity and direction. Beam separators may induce dispersion in a beam. Deflection scanning unit 226 or deflector 132c may be another example of a component that induces dispersion of a beam. An aberration corrector may be disposed adjacent to an optical component that induces dispersion in a beam. An aberration corrector may be provided that is configured to compensate for aberration introduced by a component of a charged particle beam system, such as beam separator 158, beam separator 222, deflection scanning unit 226, or deflector 132c. In some embodiments, an aberration corrector may be provided downstream from a component that introduces aberration. An aberration corrector may be provided between an objective lens and a sample, or between a beam separator and a detector, for example.

As discussed above with reference to FIG. 8, prism 820 may be provided as a dispersive element. However, in some embodiments, functions of some components in a charged particle beam system may overlap, and some components may be shared or omitted. For example, rather than providing a separate dispersive element, prism 820 may be omitted and downstream components such as lenses 825, prism 830, and aperture array 840 may be provided directly following another component of a charged particle beam system. As one example, a magnetic lens of a beam separator may constitute a dispersive element. Aperture array 840 may be provided downstream of the beam separator. Optical element 850 may be provided downstream of aperture array 840. Optical element 850 may include lens array 851, deflector array 852, or focusing lens 859. In some embodiments, components such as lenses 825, prism 830, aperture array 840, and optical element 850 may be provided after a lens, such as an objective lens.

Figure 11:
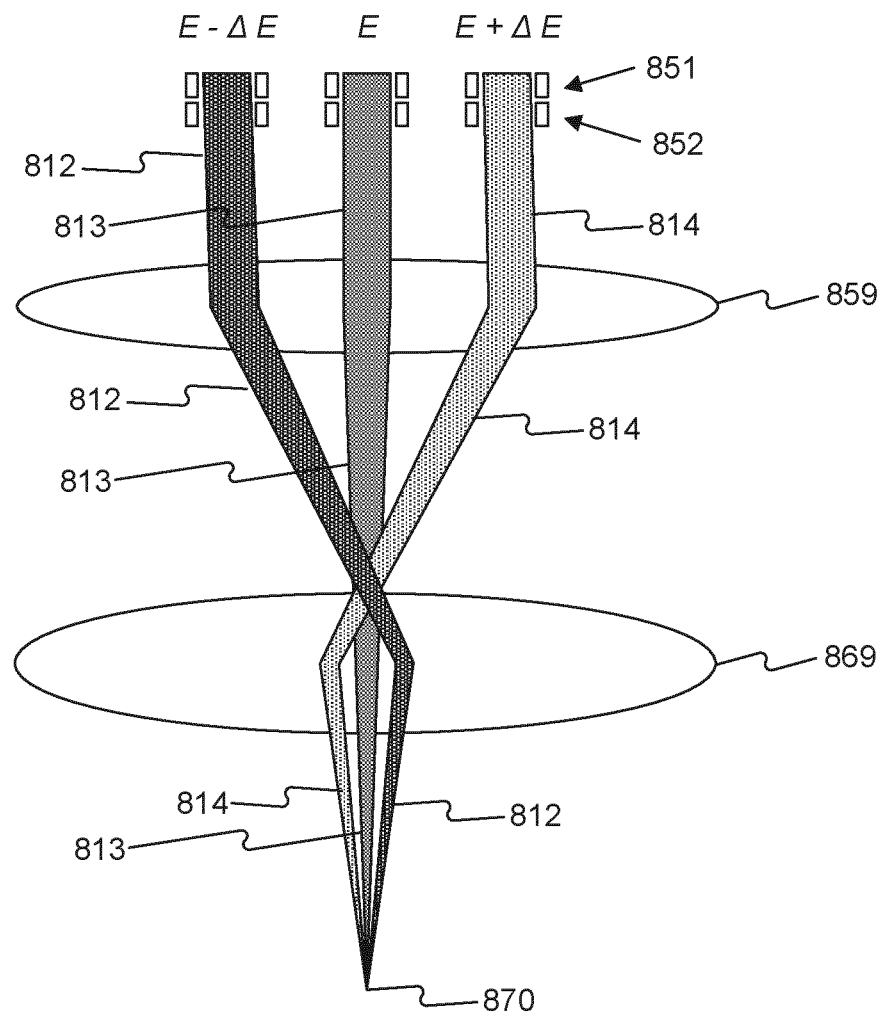
FIG. 11 illustrates a correction of aberration that accounts for more than one lens, consistent with embodiments of the present disclosure.

Reference is now made to FIG. 11, which illustrates correction of aberration for a plurality of optical elements, consistent with embodiments of the disclosure. Like the example of FIG. 10C, deflector array 852 may be configured to deflect beamlets 812, 813, and 814 so that a common focal point is not formed directly downstream of lens 859. Instead, deflector array 852 may be configured to deflect beamlets so as to overcompensate for aberration that may be caused by lens 859. Deflector array 852 may be configured to deflect beamlets so that a common focal point 870 is formed downstream of a second lens 869.

In some embodiments, a chromatic aberration coefficient may be determined for a system that includes multiple optical elements. Controller 109 may determine based on an arrangement of lenses or other optical elements in an optical system a target chromatic aberration coefficient. Controller 109 may determine an amount of deflection for each deflector of deflector array 852. The amounts of deflection may take into account a projected beam path through a plurality of lenses. Other components, such as lens array 851, may also take into account effects of multiple optical elements and be configured to correct for them.

A method of mitigating aberration may include inducing dispersion in an input beam and generating beamlets having a reduced energy spread relative to the input beam. The method may include a first step and a second step. The first step may include forming beamlets and the second step may include deflecting or focusing the beamlets in a manner that enhances the focus of the beam. The first step may enable individual beamlets to be formed with reduced energy spread. The method may reduce chromatic aberration.

Figure 12:
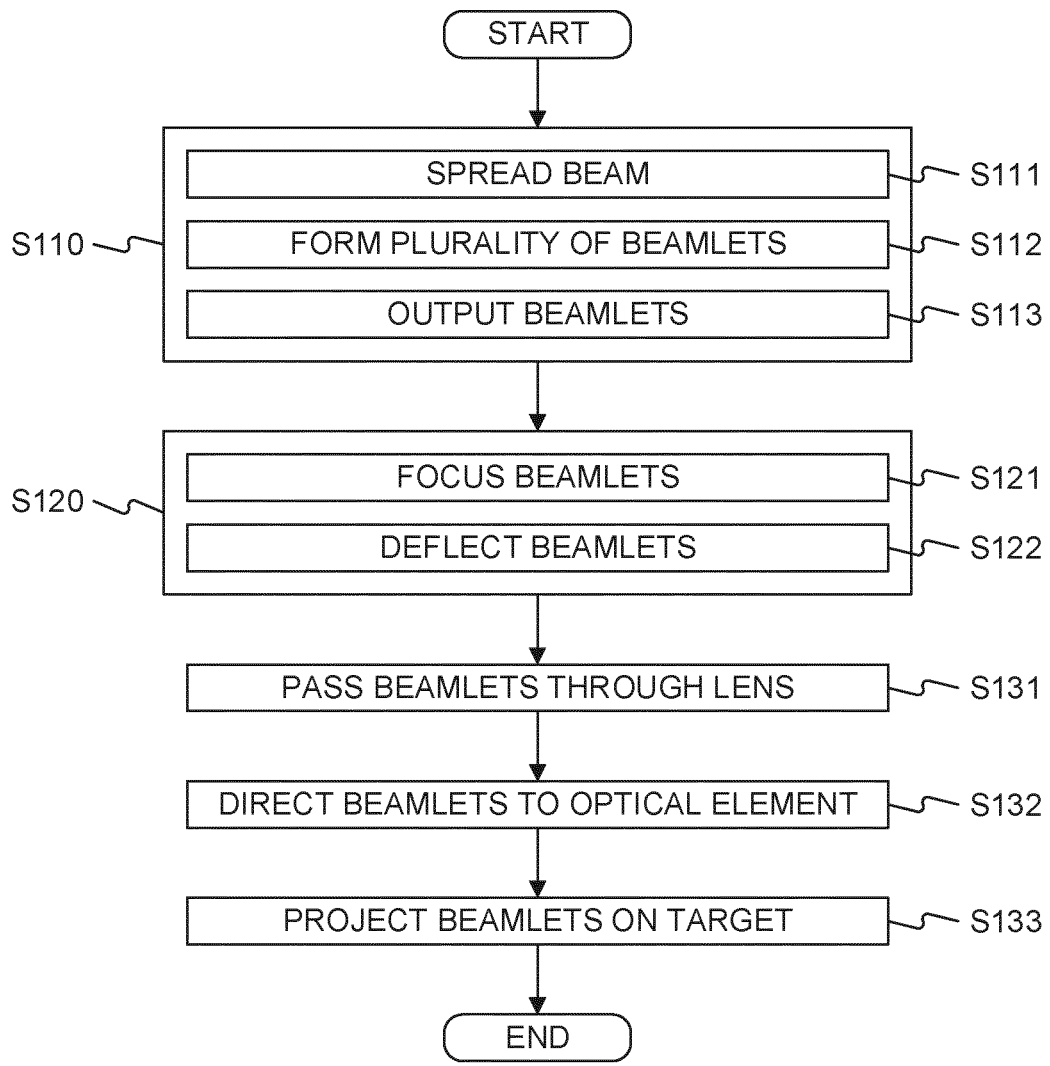
FIG. 12 is a flow chart illustrating an exemplary method of correcting aberration, consistent with embodiments of the present disclosure.

FIG. 12 is a flowchart illustrating an exemplary method for mitigating aberration, consistent with embodiments of the present disclosure. The method of FIG. 12 may be performed by controller 109 of EBI system 10, as shown in FIG. 1, for example. Controller 109 may be programmed to implement one or more blocks of the flowchart illustrated in FIG. 12. For example, controller 109 may instruct a module of a charged particle beam system to generate a charged particle beam and carry out other functions. Controller 109 may control actuation of aperture array 840, lens array 851, or deflector array 852.

A method consistent with FIG. 12 may begin with generating a charged particle beam by a charged particle beam source. For example, a primary beam source that includes anode 102 and cathode 103 may generate a charged particle beam, as shown in FIG. 2.

As shown in FIG. 12, a first step S110 may be performed. First step S110 may include inducing dispersion in an input beam. The dispersion may be based on the energy distribution of the input beam. First step S110 may include a step S111 of spreading a beam. Spreading the beam may include causing beamlets included in a beam to spread out. The beamlets may become physically spaced apart from one another. Spreading may cause parts of the beam having different energy to become further apart from one another. Step S111 may include inputting input beam 811 into first prism 820, for example as discussed above with reference to FIG. 8. Step S111 may be performed by a component of a charged particle beam system that may induce dispersion in a beam, such as a beam separator, deflector, or lens. Step S111 may include driving the component with a predetermined electrical signal.

As shown in FIG. 12, first step S110 may also include a step S112 of forming a plurality of beamlets. Beamlets may be formed as the constituent parts of a beam spread apart. Discrete beamlets may be formed that are physically spaced apart from one another. The beamlets may include particles that are at different energy levels, but that may be closer in energy to one another than an input beam. Each of the beamlets may have a central energy level and a range of energy spread. Step S112 may include passing beamlets through an aperture. Step S112 may include transmitting beamlets through aperture array 840, for example as discussed above with reference to FIG. 8. Step S112 may include cutting off peripheral regions of beamlets.

As shown in FIG. 12, first step S110 may also include a step S113 of outputting beamlets. Step S113 may include outputting the plurality of beamlets formed in step S112. Step S113 may include outputting beamlets from aperture array 840. Step S113 may include collecting one or more of the beamlets formed in step S112. In some embodiments, step S113 may include selectively outputting beamlets. For example, some beamlets may be blocked by actuating a shutter or blanker, etc. Beamlets output from step S113 may be directed to another component.

Furthermore, as shown in FIG. 12, a second step S120 may be performed. Second step S120 may include deflecting or focusing beamlets so as to enhance a beam focus. Second step S120 may include a step S121 of focusing beamlets. The beamlets may be those output from step S113. Step S121 may include focusing beamlets differently based on their distance from a central axis. The central axis may be the axis passing through a central deflector or lens of an array. Step S121 may be performed by an array of lenses, such as lens array 851 as discussed above with reference to FIG. 10B. Beamlets entering the array of lenses may be spaced apart from one another, and lenses of the array of lenses may focus each of the beamlets differently based on its location. Beamlets exiting the array of lenses may enter another optical component, such as a focusing lens, at different radial positions relative to a central axis of the focusing lens. Lenses of the array of lenses may focus each of the beamlets so as to reduce or eliminate field curvature aberration As shown in FIG. 12, second step S120 may also include a step S122 of deflecting beamlets. Step S122 may include deflecting beamlets differently based on energy levels. Step S122 may be performed by an array of deflectors, such as deflector array 852 as discussed above with reference to FIG. 10B. Each of the beamlets entering a deflector of the array of deflectors may have a different energy and the respective deflector may deflect the beamlet based on its energy. Beamlets may be deflected so as to have a certain angle of entering a lens downstream of the array of deflectors.

Step S122 may include deflecting beamlets so as to reduce or eliminate chromatic aberration. Step S122 may include deflecting beamlets so that a beam focus improves. Beamlets may be deflected so that they converge to a common focal point or image plane downstream from a focusing lens. Step S122 may include deflecting beamlets so as to reduce or eliminate astigmatism.

As shown in FIG. 12, a method of mitigating aberration may include other steps, including a step S131 of passing beamlets through a lens. The lens may be a focusing lens provided downstream from the array of deflectors or lenses. Step S131 may include focusing beamlets together. The beamlets may form a focus together at, for example, common focal point 860, discussed above with respect to FIG. 10B.

The method of mitigating aberration may include a step S132 of directing beamlets to another optical element. For example, beamlets may be directed to another lens, a deflector, a secondary imaging system, etc. The other optical element may include, for example lens 869, as discussed above with reference to FIG. 11. Step S121 of deflecting beamlets may include deflecting beamlets so as to overcompensate for chromatic aberration. Step S121 may include deflecting beamlets so as to have a negative chromatic aberration coefficient. Step S121 may include compensating for aberration that may be caused by multiple optical elements, including a focusing lens and another component, for example.

The method of mitigating aberration may include a step S133 of projecting beamlets on a target. The target may include a sample, such as wafer 150 or wafer 230. Step S121 of deflecting beamlets may include deflecting beamlets so as to form a common focal point on the surface of the sample.

In some embodiments, first step S110 may include reducing an energy spread of an electron beam. Beamlets may be formed that each have an energy spread less than that of an input beam. In some embodiments, first step S110 may be applied to a multi-beam system, such as apparatus 100B, as discussed above with reference to FIG. 3. For example, beamlets may be passed through an aperture array and fed through source conversion unit 212. Beamlets may be output from the aperture array with reduced energy spread relative to that of an input beam, such as primary electron beam 211 that may be emitted from gun aperture 204. In some embodiments, first step S110 may be applied at various other location in a charged particle beam system. For example, first step S110 may be applied at beam separator 158 of apparatus 100A, as discussed above with reference to FIG. 2, or at beam separator 222 of apparatus 100B, as discussed above with reference to FIG. 3.

In some embodiments, second step S120 may include mitigating or compensating for aberration. Second step S120 may include modifying a chromatic aberration coefficient of an electron optical system. Second step S120 may be applied after first step S120.

Figure 13:
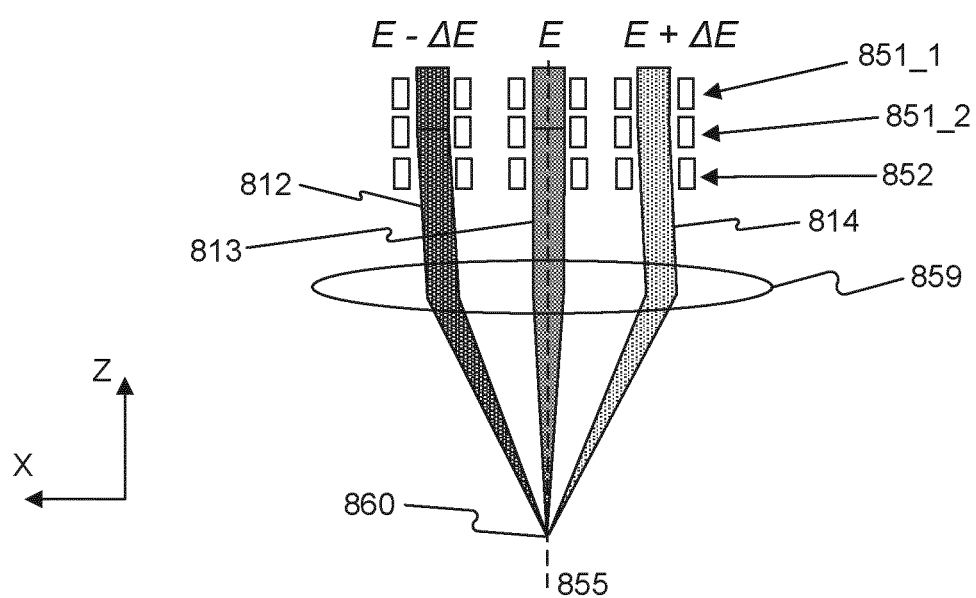
FIG. 13 illustrates a deflector array and a lens having a first lens array and a second lens array, consistent with embodiments of the present disclosure

Reference is now made to FIG. 13, which illustrates a deflector array and a lens having a first lens array and a second lens array, consistent with embodiments of the present disclosure. In some embodiments, a lens array may include a plurality of layers of micro lenses. A first lens array 851_1 and a second lens array 851_2 may be provided. First and second lens arrays 851_1 and 851_2 may be formed by MEMS devices. First and second lens arrays 851_1 and 851_2 may be included in optical element 850 of FIG. 8.

First lens array 851_1 may be configured to correct for astigmatism. Astigmatism may refer to a type of aberration caused by off-axis parts of beams. For example, an off-axis beamlet may enter a lens at a position some distance away from the central axis of the lens. The off-axis beamlet may experience astigmatism aberration. The magnitude of astigmatism aberration may be related to the square of the distance from the central axis.

First lens array 851_1 may include an array of multipole lenses. A multipole lens may have a structure like a deflector. Multipole lenses of second lens array 851_2 may each have, for example, 4 or more poles. Voltages may be applied to lenses of second lens array 851_2 so as to influence beamlets passing through the lenses so as to correct for astigmatism aberration. Correcting for astigmatism aberration may involve influencing a trajectory of beamlets.

Second lens array 851_2 may be configured to compensate for field curvature aberration, similar to lens array 851 of FIGS. 10B-11. Lenses of second lens array 851_2 may include round lenses. Each of the lenses may include an annular structure that may surround a beamlet. Each of the lenses may include a monopole lens, for example Second lens array 851_2 may be arranged downstream from first lens array 851_1 such that beamlets 812, 813, and 814 travel first through first lens array 851_1 and then through second lens array 851_2. In some embodiments, the positions of first lens array 851_1 and second lens array 851_2 may be reversed.

Figure 14A:
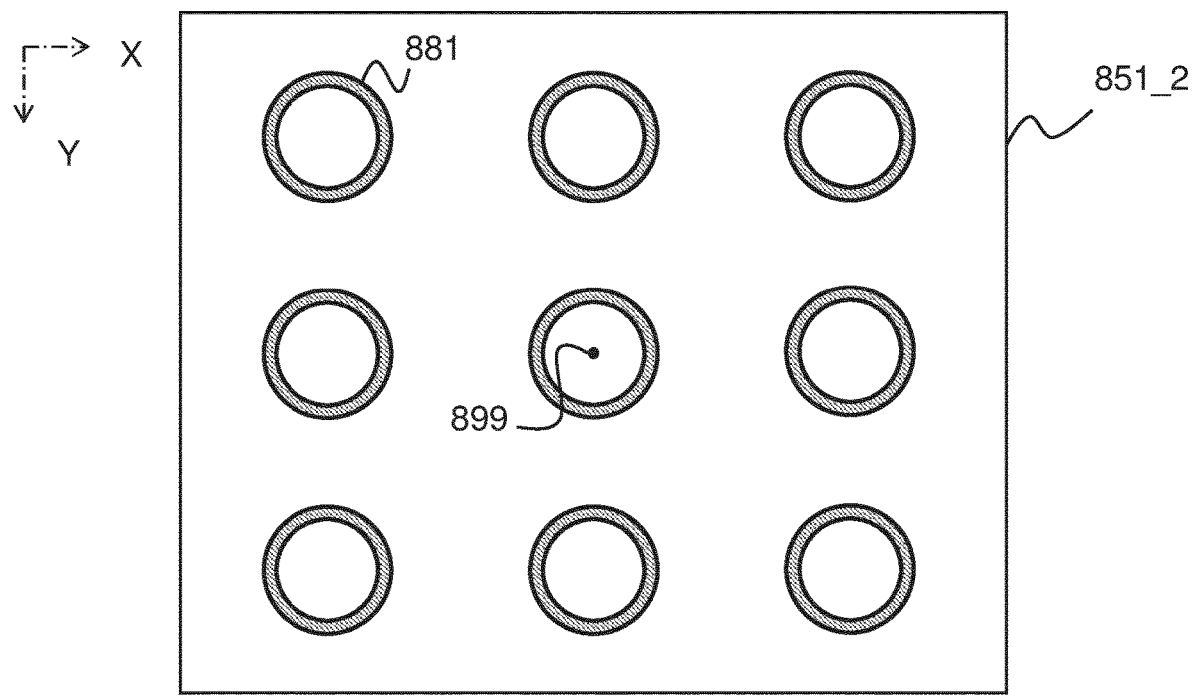
FIG. 14A and FIG. 14B are plan views of lens arrays.
Figure 14B:
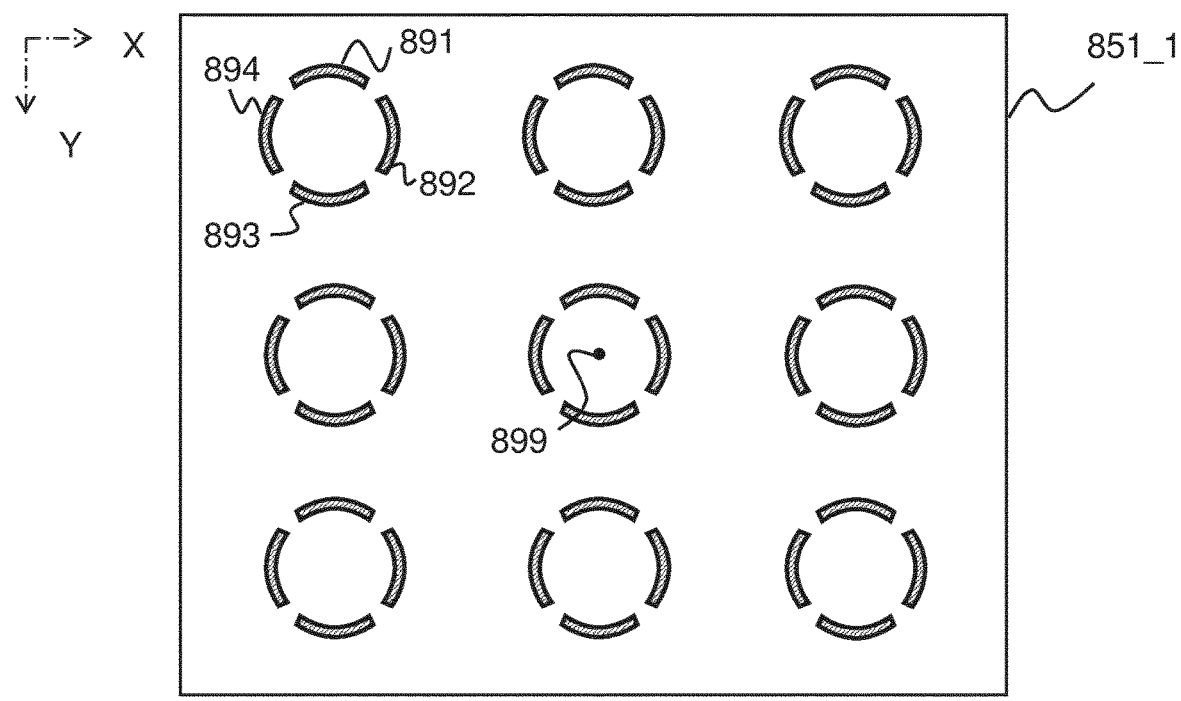

FIG. 14A shows an arrangement of an array of lenses. Second lens array 851_2 may include annular lens elements 881. FIG. 14B shows a further arrangement of lenses. First lens array 851_1 may include multipole lenses, among others. A multipole lens may include a first pole 891, second pole 892, third pole 893, and fourth pole 894. Each pole may be electrically connected to a driver. A central axis 899 of first lens array 851_1 or second lens array 851_2 may extend in the Z direction and be aligned with the center of a central lens of the array.

Second step S120, as discussed above with reference to FIG. 12, may include influencing beamlets so as to compensate for astigmatism aberration. Beamlets may be focused by first lens array 851_1 so as to compensate for field curvature aberration, then influenced by second lens array 851_2 so as to compensate for astigmatism aberration, then deflected by deflector array 852 so as to compensate for chromatic aberration. In some embodiments, order of operations may be changed. Lens array 851, as discussed above with reference to FIG. 10B, may include first lens array 851_1 and second lens array 851_2. Although 3×3 arrays of lenses are shown in FIG. 14A and FIG. 14B, other numbers of lenses may be used, for example, so as to match aperture array 840. In some embodiments, lenses of an array may be omitted, for example when a central axis beamlet does not need to be influenced. In some embodiments, a central axis may not necessarily align with a lens or deflector (see, e.g., FIG. 9A).

In some embodiments of the disclosure, a charged particle beam system may be configured to project a single beam on a target. In some embodiments of the disclosure, a charged particle beam system may be configured to project multiple beams (e.g., beamlets) on a target. Beamlets may be produced that have different energy. Such beamlets may be directly applied to a target and the beamlets may arrive at the target with different landing energy. However, in some embodiments, beamlets may be manipulated so that they arrive at the target with the same landing energy. Monochromatic beamlets may be produced and uniform beamlets may be projected onto a target.

Figure 15:
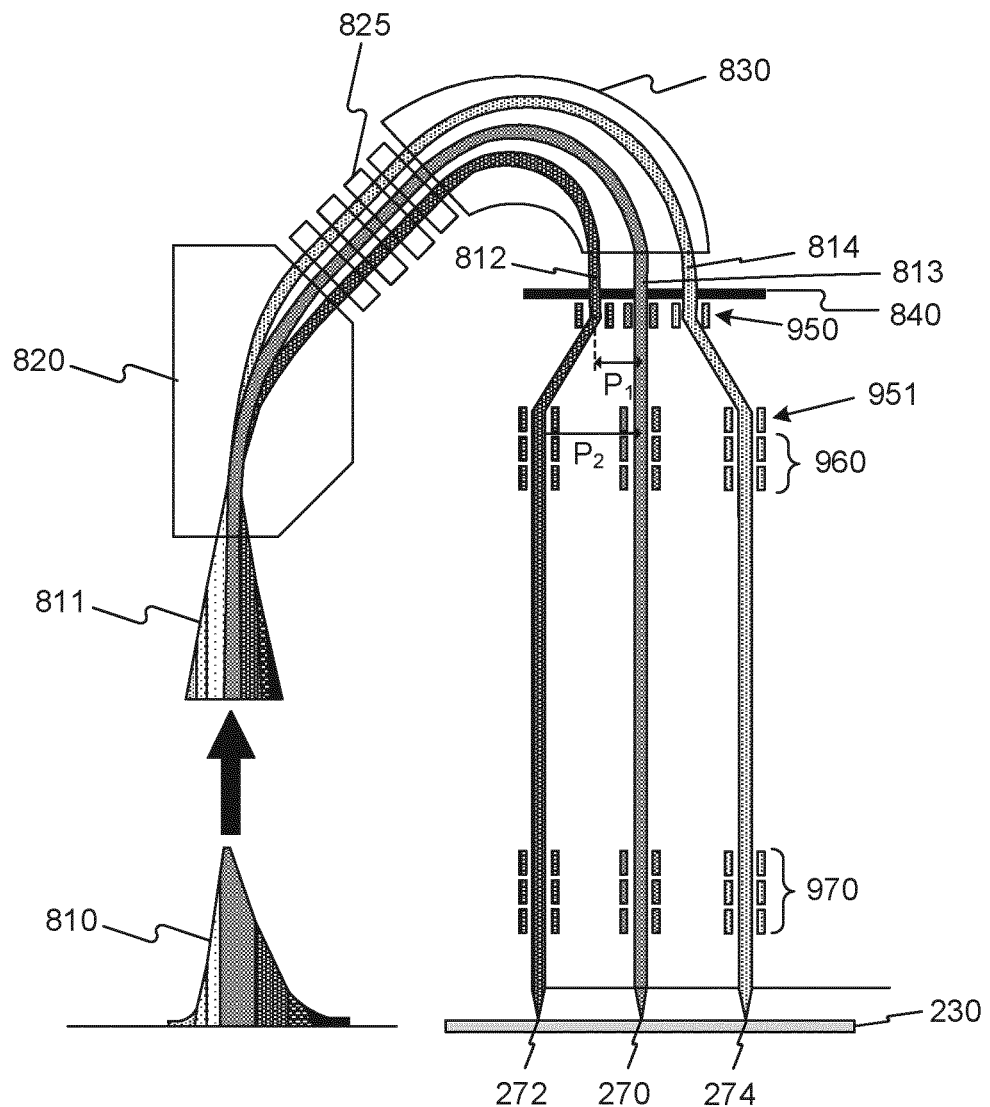
FIG. 15 illustrates projection of a plurality of beamlets projected onto a target, consistent with embodiments of the disclosure.

Reference is now made to FIG. 15, which illustrates projection of a plurality of beamlets projected onto a target, consistent with embodiments of the disclosure. Similar to FIG. 8, a system may include first prism 820 into which input beam 811 may be input. The system of FIG. 15 may be a variant of that of FIG. 8 in that optical element 850 may include various components. As shown in FIG. 15, input beam 811 generated from a charged particle beam source may pass through first prism 820 and may undergo dispersion. A spread beam may be output to lenses 825 that may control trajectory or convergence of the beams traveling through lenses 825. Lenses 825 may direct beams toward second prism 830 that may be configured to change direction of the beams passing through second prism 830. Due to dispersion induced by first prism 820 or second prism 830, constituent parts of input beam 811 may be spread apart based on their energy. For example, beamlets 812, 813, and 814 may be output from second prism 830 and may have different energy from one another. Beamlets 812, 813, 814 may pass through aperture array 840 that may trim edges of the beamlets. Each of beamlets 812, 813, and 814 may have a particular central energy and an energy spread, the energy spread being less than that of input beam 811.

As shown in FIG. 15, a first deflector 950 may be provided downstream from aperture array 840. First deflector 950 may be configured to deflect beamlets so as to alter the pitch of the beamlets. For example, beamlets entering first deflector 950 may have a pitch P1, and the beamlets may have a pitch P2 upon entering a next component, such as a second deflector 951. Pitch adjustment may be used to further process and manipulate the beamlets by various components. In some embodiments, pitch adjustment may be used to control the pitch of beam spots that may eventually be formed on a target.

First deflector 950 may be a deflector array similar to deflector array 852, for example First deflector 950 may include a plurality of individual deflectors (e.g., micro deflectors). Each of the individual deflectors may be configured to surround a respective beamlet. Individual deflectors of first deflector 950 may be aligned with respective openings 911 of aperture array 840.

Second deflector 951 may also be a deflector array. Second deflector 951 may include a plurality of individual deflectors each configured to surround a respective beamlet. A central deflector of second deflector 951 may be aligned with a central deflector of first deflector 950, or a central opening of aperture array 840. The individual deflectors of second deflector 951 may have a spacing different from that of first deflector 950. Second deflector 951 may be configured with a pitch of individual deflectors that is larger than that of first deflector 950.

First deflector 950 and second deflector 951 may be configured to adjust a pitch of beamlets. First deflector 950 may be configured to deflect beamlets away from the principal optical axis, which may be axis 855 (see FIG. 8). Second deflector 951 may be configured to deflect beamlets back toward the principal optical axis. Second deflector 951 may be configured to collimate or maintain a parallel path of the beamlets.

First lens 960 may be provided downstream from second deflector 951. Second deflector 951 and first lens 960 may be provided as a MEMS device. First lens 960 may be configured to compensate for focusing differences due to energy differences of beamlets. Furthermore, in some embodiments, first lens 960 may be configured to adjust energy of beamlets passing through first lens 960. Beamlets 812, 813, and 814 may have different energy from one another, and first lens 960 may be configured to influence the beamlets differently based on their energy. For example, as discussed above, beamlet 812 may be the least energetic beamlet, beamlet 813 may be a beamlet with nominal energy, and beamlet 814 may be the most energetic beamlet. First lens 960 may be configured to apply a focusing power to beamlet 814 that is different from that for beamlet 812. Additionally, first lens 960 may be configured for energy adjustment. First lens 960 may be configured to raise an energy level of beamlet 812 and to decrease an energy level of beamlet 814. First lens 960 may maintain the energy level of beamlet 813 at the nominal energy level. In some embodiments, first lens 960 may be configured to raise the energy level of all beamlets up to a predetermined energy level. The predetermined energy level may be equal to that of beamlet 814, the most energetic beamlet. Thus, first lens 960 may be configured to maintain the energy level of beamlet 814.

First lens 960 may include a plurality of electrostatic lenses. Like first deflector 950 and second deflector 951, an array of components may be provided such that a component surrounds each beamlet. Each component may include a lens that may comprise annular electrodes or pole pieces. Furthermore, each component may include a plurality of electrodes. First lens 960 may be configured to apply a weak focusing strength to beamlets passing through so as to influence their energy without substantially affecting their focus. Furthermore, in some embodiments, different electrodes may be used to adjust beamlet energy and to compensate for focusing strength differences. Driving signals may be applied to each of the components surrounding individual beamlets. The driving signal may cause an electrostatic field to be generated in the component that may influence the beamlet passing through the component in proportion to the magnitude of the electrostatic field. Differences in field strength may be used to adjust energy levels of beamlets to compensate for differences in energy levels among the beamlets. For example, a large field may be used to raise the energy level of a less energetic beamlet.

A multi-beam system may be configured to generate a plurality of beamlets that are projected on a target so as to form a plurality of beam spots. For example, as shown in FIG. 3, beamlets 214, 216, and 218 are projected on wafer 230 so as to form beam spots 270, 272, and 274. Similarly, as shown in FIG. 15, beamlets 812, 813, and 814 may form beam spots 270, 272, and 274 on wafer 230. In some embodiments, monochromatic beamlets may be formed so that beam spots 270, 272, and 274 are uniform.

An objective lens may be used to focus beamlets so as to form beam spots 270, 272, and 274 on a target, such as wafer 230. In some embodiments, a multi-beam system may include multiple objective lenses, each of which may be configured to focus a beamlet onto a target surface. In some embodiments, a multi-beam system may include a single objective lens that focuses all beamlets onto the target surface.

As shown in FIG. 15, second lens 970 may be provided that may be an example of multiple objective lenses in a multi-beam system. Second lens 970 may be used to focus each beamlet onto a target, such as wafer 230. Second lens 970 may be a lens array that includes a plurality of lenses, each of the lenses configured to surround a beamlet. Each lens of the plurality of lenses may include multiple electrodes. Different electrodes may be used for different purposes or may be used together to accomplish functions. For example, in lens 970, electrodes may be configured to 1) focus beamlets on wafer 230, and 2) perform astigmatism correction. An astigmatism correction unit may be arranged upstream from a focusing unit. Furthermore, in some embodiments, astigmatism correction may be accomplished in lens 960. In some embodiments, some electrodes may be used to implement energy adjustment, while some are used for focus correction, astigmatism correction, field curvature correction, etc. Second lens 970 may be formed as a MEMS device.

Figure 16:
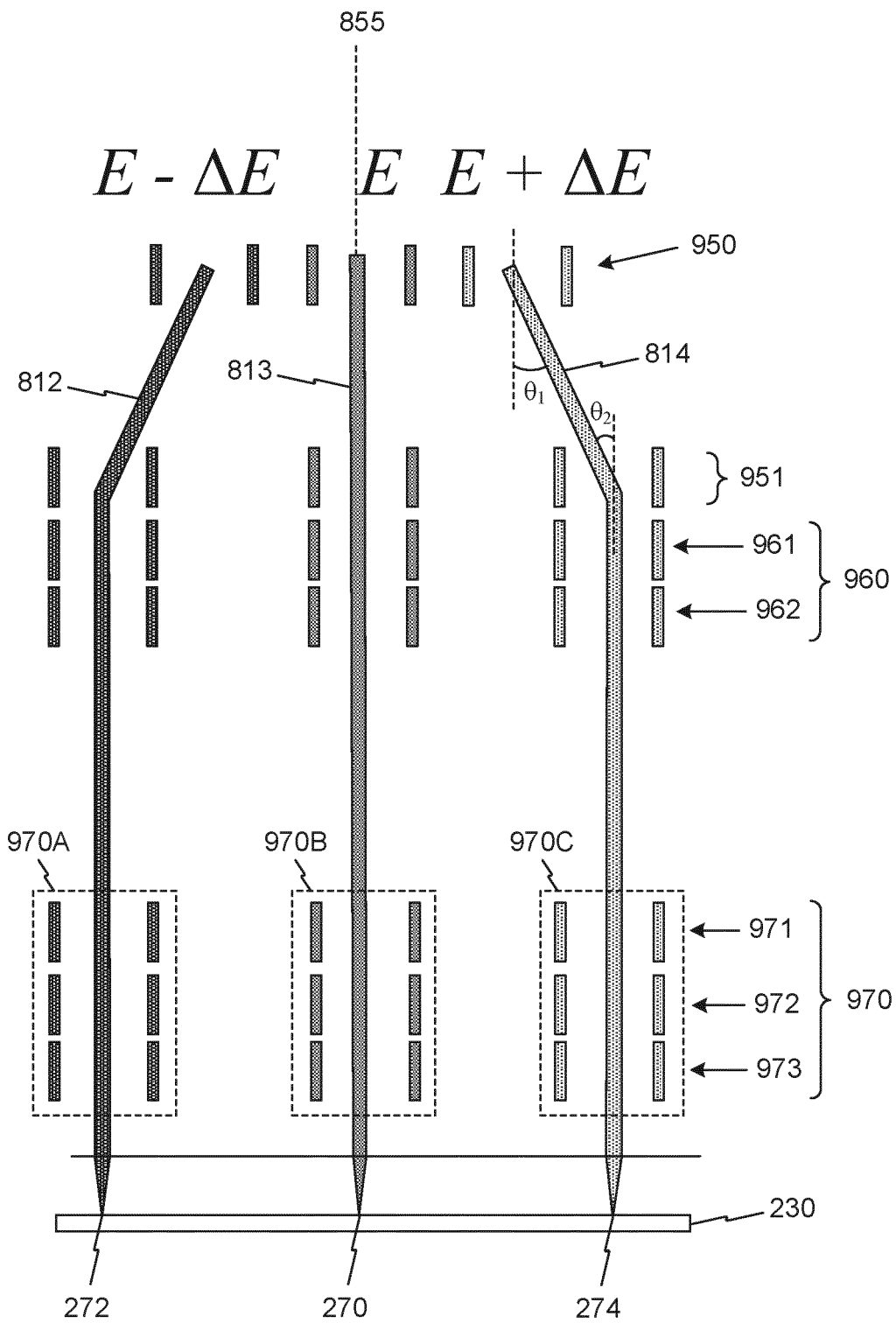
FIG. 16 illustrates projection of a plurality of beamlets onto a target, consistent with embodiments of the disclosure.

Reference is now made to FIG. 16, which illustrates projection of a plurality of beamlets onto a target, consistent with embodiments of the disclosure. FIG. 16 may represent an enlargement of a portion of FIG. 15.

First deflector 950 and second deflector 951 may be configured to impart predetermined amounts of deflection onto beamlets. As shown in FIG. 16, beamlet 814 may be deflected by an angle θ1 by first deflector 950, and may be deflected by an angle θ2 by second deflector 951. Angles θ1 and θ2 may be equal. Beamlets 812, 813, and 814 may have different energy from one another, and so first deflector 950 and second deflector 951 may be configured to deflect the beamlets differently. For example, first deflector 950 and second deflector 951 may be configured to influence beamlets 812, 813, and 814 differently based on their energy. Beamlet 812 may be deflected by angles that are not necessarily the same as angles θ1 and θ2 for beamlet 814. Or, a different amount of excitation may be applied to an individual set of deflectors for beamlet 812 so that it is deflected by the same amount, although its energy may be less than that of, for example, beamlet 814. First deflector 950 and second deflector 951 may be configured to influence beamlets of different energy such that a predetermined spacing (e.g., pitch of the beamlets) is achieved. Furthermore, first deflector 950 and second deflector 951 may be configured so as to maintain a collimated state while adjusting pitch of the beamlets. Beamlets at different energy may require different excitation to be deflected a certain amount. First deflector 950 and second deflector 951 may be configured to compensate for energy differences of beamlets and deflect the beamlets differently so that predetermined spacing of beamlets may be achieved.

As shown in FIG. 16, first lens 960 may include a first lens array 961 and a second lens array 962. First lens array 961 and second lens array 962 may include a plurality of annular lens elements, similar to lens array 851_2 shown in FIG. 14A, or poles similar to lens array 851_1 shown in FIG. 14B. Different lens arrays among first lens 960 may be configured to accomplish different functions. Or, different lens arrays may be configured to work together. For example, a potential may be formed between the electrodes of different lens array. A beamlet may have its energy adjusted by passing through an electric field.

Second lens 970 may include a first lens array 971, a second lens array 972, and a third lens array 973. In some embodiments, more or less lens arrays may be provided. Second lens 970 may form a plurality of objective lenses. For example, a first objective lens 970A may be formed that is provided around beamlet 812. A second objective lens 970B may be formed that is provided around beamlet 813. And a third objective lens 970C may be formed that is provided around beamlet 814. First objective lens 970A may be configured to focus beamlet 812 on wafer 230 to form beam spot 272. Second objective lens 970B may be configured to focus beamlet 813 on wafer 230 to form beam spot 270. Third objective lens 970C may be configured to focus beamlet 814 on wafer 230 to form beam spot 274. Put another way, the objective lens may be configured to form an image plane on a surface of the target. Although FIG. 16 shows only three beamlets and three objective lenses, it will be appreciated that there may be more or less than three objective lenses and other components. For example, there may be a 2×2, 3×3, . . . 9×9, etc. array of components corresponding to beamlets.

Figure 17:
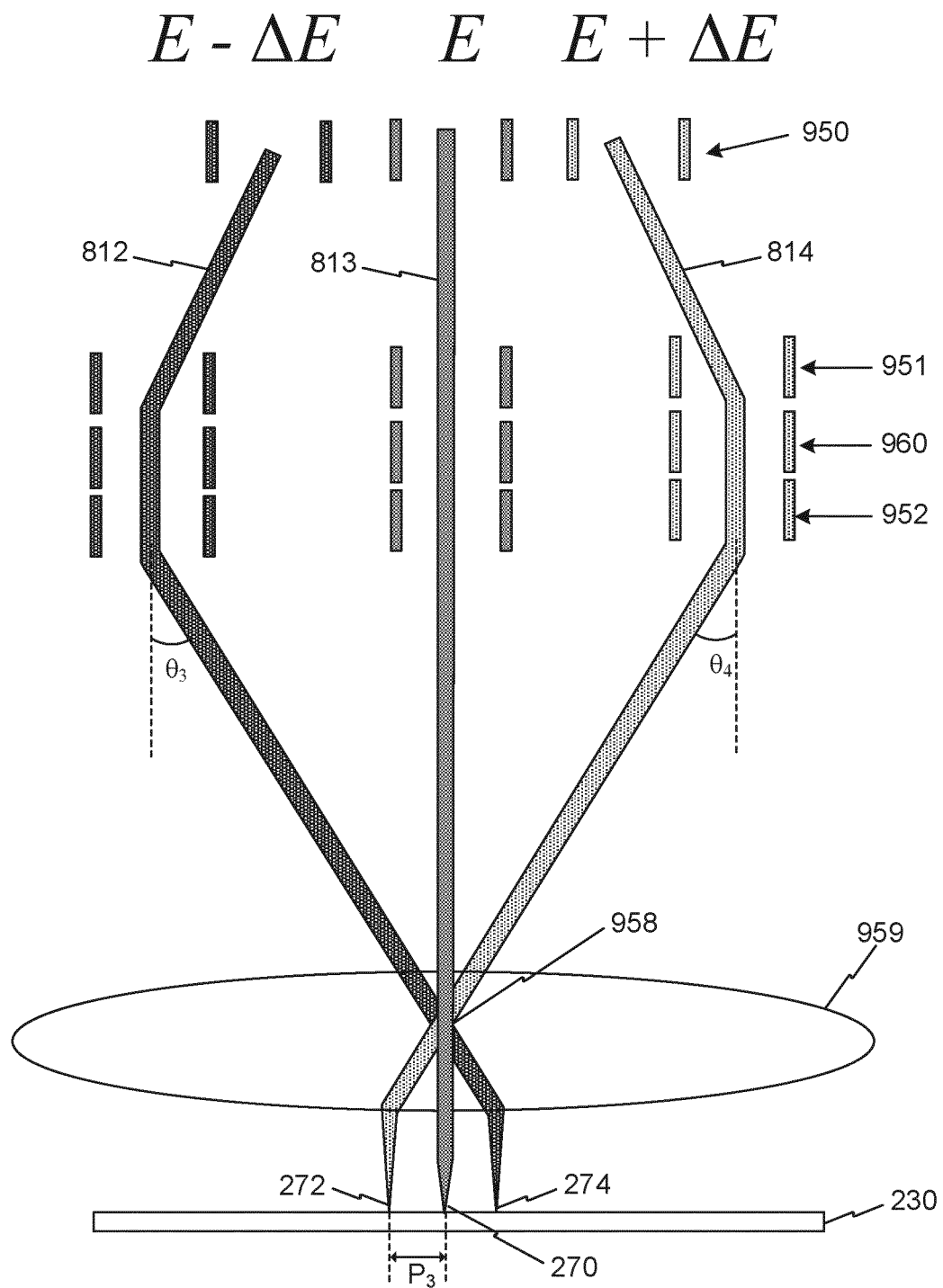
FIG. 17 illustrates projection of a plurality of beamlets onto a target, consistent with embodiments of the disclosure.

Reference is now made to FIG. 17, which illustrates projection of a plurality of beamlets onto a target, consistent with embodiments of the disclosure. Beamlets passing through first deflector 950 may be those emerging from aperture array 840 (see FIG. 8). FIG. 17 may represent an enlargement of an alternative arrangement of a portion of FIG. 15 downstream from aperture array 840. Different from FIG. 16, for example, a single objective lens may be provided in the system of FIG. 17. Furthermore, a different arrangement may be used for first lens 960, and further components may be provided.

First lens 960 may be configured to compensate for focusing differences due to energy differences of beamlets, or to adjust energy of beamlets passing through first lens 960. As shown in FIG. 17, first lens 960 may include an array of lenses, each of the lenses including a single electrode. An electrode of an adjacent component, such as second deflector 951, or another deflector, may be used together with first lens 960 to form an electric field.

Also, a third deflector 952 may be provided. Third deflector 952 may be a deflector array. Third deflector 952 may include a plurality of individual deflectors each configured to surround a respective beamlet. A central deflector of third deflector 952 may be aligned with a central deflector of first deflector 950, second deflector 951, or a central opening of aperture array 840. The individual deflectors of third deflector 952 may have a spacing similar to that of second deflector 951 and first lens 960, and that may be different from that of first deflector 950. Third deflector 952 may be configured to correct astigmatism. In some embodiments, a further array may be added between third deflector 952 and first lens 960, the further array being configured to correct astigmatism.

Third deflector 952 may be configured to direct beamlets into an objective lens 959. Beamlets may form a crossover 958 before reaching wafer 230. Third deflector 952 may be configured to form crossover 958 in a region of objective lens 959. For example, third deflector 952 may be configured to form crossover 958 at a median plane of objective lens 959.

Third deflector 952 may be configured to deflect beamlets differently based on energy of beamlets. For example, similar to deflector array 852, third deflector 952 may be configured to compensate for aberration, and may be configured to reduce chromatic aberration.

Objective lens 959 may be provided downstream from third deflector 952. Objective lens 959 may be configured to surround all of beamlets 812, 813, and 814. Objective lens 959 may be configured so that a common focusing field is applied to all of beamlets 812, 813, and 814. Objective lens 959 may be configured to focus all beamlets onto wafer 230.

However, as discussed above with reference to FIG. 10A, for example, individual beamlets may be at different energy levels, and may experience different focusing power as they travel through a downstream lens, such as lens 859 (see FIG. 10A) or objective lens 959 (see FIG. 17). One way to address this issue is to deflect beamlets differently based on their energy so that they arrive at the downstream component in a state such that chromatic aberration is mitigated. Deflectors, such as third deflector 952 may be configured to deflect beamlets differently based on their energy to compensate for aberration.

In some embodiments, lens 960 may be configured to adjust energy of beamlets so as to compensate for chromatic aberration. Then, third deflector 952 of FIG. 17 may be configured to deflect beamlets differently based on their energy to mitigate off-axis aberrations of off-axis beamlets. For example, third deflector 952 may be configured to deflect beamlet 812 at an angle θ3. Third deflector 952 may be configured to deflect other beamlets at different angles. Also, third deflector 952 may be configured to deflect beamlet 814 at an angle θ4. Angle θ3 and angle θ4 may be different. Beamlet 813 may be an on-axis beamlet and may not require deflection.

In some embodiments, deflector 952 may be configured to deflect beamlets uniformly. Thus, angle θ3 and angle θ4 may be equal. First lens 960 may be configured to adjust energy of beamlets. For example, as discussed above with reference to FIG. 16, first lens 960 may include a plurality of lens arrays. A potential may be formed between the different lens arrays that may be used to add energy to the beamlet or reduce energy. A beamlet traveling through a plurality of lenses may have its energy adjusted accordingly.

First lens 960 may be configured to adjust energy of beamlets travelling through first lens 960 such that one or more beamlets have a predetermined energy. All beamlets travelling through first lens 960 may be adjusted to have the predetermined energy. Beamlets may be deflected by third deflector 952 and may be directed to objective lens 959. All beamlets input to objective lens 959 may have the same energy, and chromatic aberration may be reduced or prevented. All beamlets input to objective lens 959 may be monochromatic, and all beamlets projected onto wafer 230 may be monochromatic.

In some embodiments, first lens 960 may be configured to adjust energy of beamlets so that they are monochromatic upon emerging from first lens 960. In some embodiments, first lens 960 may be configured to adjust energy of beamlets so that they are partially monochromatic. First lens 960 may be configured to partially adjust energy of beamlets travelling through lens array 960. First lens 960 may adjust energy of the beamlets to a certain extent, and then third deflector 952 may be used to deflect beamlets differently based on their energy so as to compensate for any remaining chromatic aberration.

Furthermore, third deflector 952 may be configured to adjust a pitch of beamlets 812, 813, and 814. Third deflector 952 and objective lens 959 may together determine the pitch of beamlets incident on wafer 230. For example, third deflector 952 may be configured to direct beamlets 812, 813, and 814 to objective lens 959 such that upon emerging from objective lens 959, the beamlets are projected onto wafer 230 at a pitch P3. Pitch P3 may be different from pitch P2 or pitch P1. Pitch P3 may be adjusted to be relatively small so as to form a small region of interest on wafer 230. A small region of interest may be useful in some applications, for example, metrology.

By using a single common objective lens, a multi-beam system may be enabled to form an immersion field that immerses a region of interest on wafer 230. For example, objective lens 959 may include a magnetic immersion lens. An immersion field may be advantageous because a small aberration coefficient may be achievable, and thus imaging resolution may be improved.

Additionally, in some embodiments that use a single common objective lens, a detection system including a single beam separator may be used. For example, beam separator 222 (see FIG. 3) that may be of a Wien Filter type may be used to direct secondary or backscattered electrons emitted from beam spots 270, 272, and 274 toward electron detection device 244.

In some embodiments that use multiple objective lenses, for example that of FIG. 15 and FIG. 16, a multi-beam system may be configured to use a large number of beamlets. Deflectors, such as first deflector 950 and second deflector 951, may be configured to adjust the pitch of beamlets. The larger the pitch, the more space that may be made available in the multi-beam system. Increased space may allow the multi-beam system to accommodate further components, such as more lenses or deflectors in lens or deflector arrays, and this may enable the number of beamlets to be increased. A pitch of beamlets may be adjusted based on size constraints of components in the multi-beam system. For example, the pitch may be adjusted so as to accommodate a particular number or arrangement of deflectors and lenses.

Additionally, embodiments using multiple objective lenses may avoid a common crossover of beamlets. Instead of crossing over one another, beamlets may be configured to have trajectories such that they do not overlap. For example, the beamlets may be maintained in parallel. Preventing beamlets from overlapping may reduce electron-electron interactions (e.g., the Coulomb effect) among charged particles of different beamlets. Such interactions may adversely affect imaging resolution. Thus, in some embodiments, multiple objective lenses may be used to enable larger numbers of beamlets to be used and to enhance imaging resolution.

In embodiments using multiple objective lenses, signal detection may be implemented using individual detectors provided for each beamlet. For example, a detector may be monolithically integrated in the last electrode of the multiple objective lenses that may be formed by second lens 970.

Figure 18:
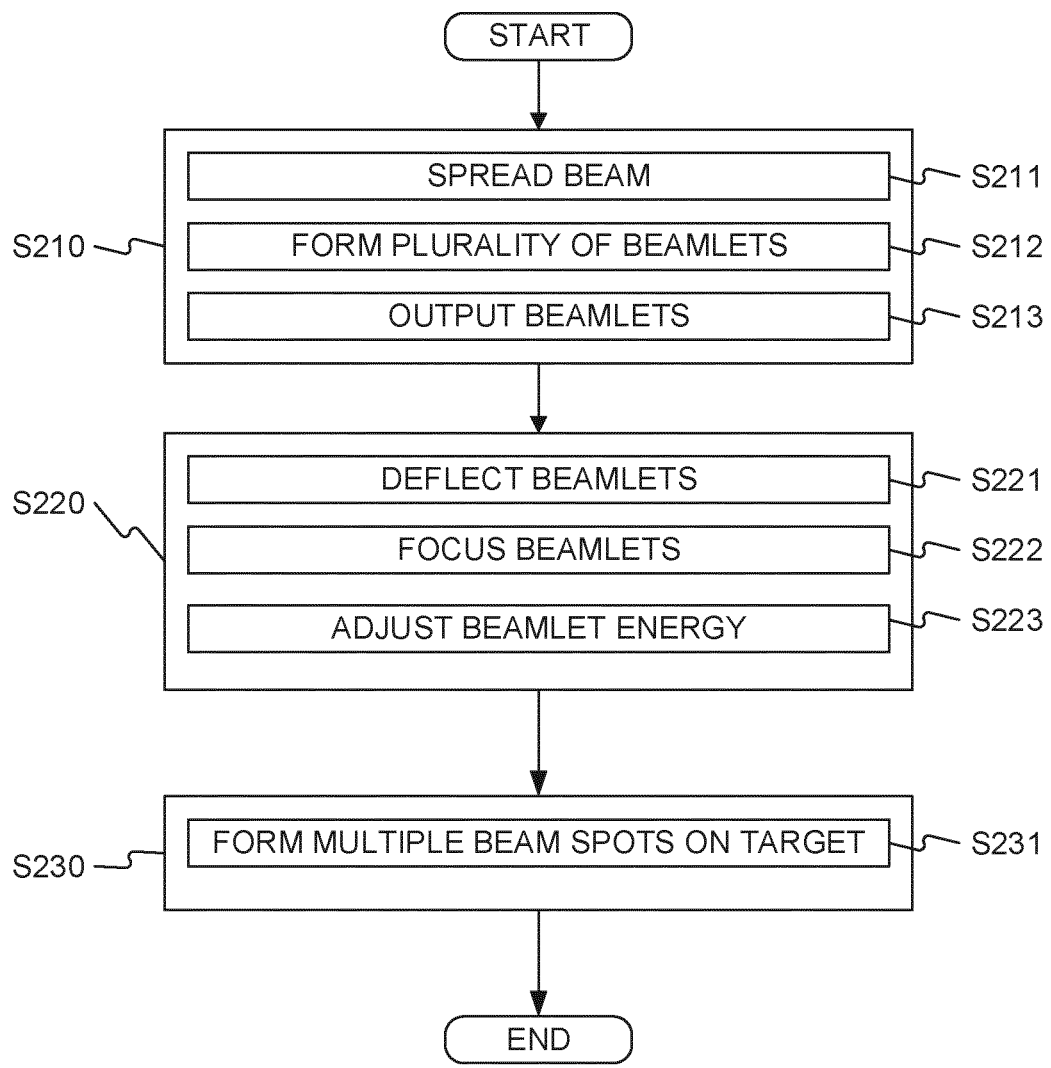
FIG. 18 is a flowchart illustrating an exemplary method for providing multiple beamlets to a target, consistent with embodiments of the present disclosure.

FIG. 18 shows a flowchart illustrating an exemplary method for providing multiple beamlets to a target, consistent with embodiments of the present disclosure. The method of FIG. 18 may be performed by controller 109 of EBI system 10, as shown in FIG. 1, for example Controller 109 may be programmed to implement one or more blocks of the flowchart illustrated in FIG. 18. For example, controller 109 may instruct a module of a charged particle beam system to generate a charged particle beam and carry out other functions. Controller 109 may control actuation of aperture array 840, first deflector 950, second deflector 951, third deflector 952, first lens 960, or second lens 970.

A method consistent with FIG. 18 may begin with generating a charged particle beam by a charged particle beam source. For example, a primary beam source that includes anode 102 and cathode 103 may generate a charged particle beam, as shown in FIG. 2.

As shown in FIG. 18, a first step S210 may be performed. First step S210 may include inducing dispersion in an input beam. First step S210 may be similar to first step S110 discussed above with reference to FIG. 12.

As shown in FIG. 18, first step S210 may include a step S211 of spreading a beam, a step S212 of forming a plurality of beamlets, and a step S213 of outputting beamlets. Step S213 may include outputting beamlets 812, 813, and 814 from aperture array 840.

Furthermore, as shown in FIG. 18, a second step S220 may be performed. Second step S220 may include manipulating beamlets. Second step S220 may include deflecting beamlets, focusing beamlets, or adjusting beamlet energy. Second step S220 may include manipulating beamlets so as to produce monochromatic beamlets.

Second step S220 may include a step S221 of deflecting beamlets. The beamlets may be those output from step S213. Step S221 may include adjusting a pitch of beamlets. For example, first deflector 950 may be used to deflect beamlets so as to increase beamlet pitch. Beamlet pitch may be increased so that beamlets may be directed to further downstream components.

Step S221 may include deflecting beamlets differently based on their energy. Energy of beamlets may correspond to their location upon emerging from second prism 830 or aperture array 840. Step S221 may include deflecting beamlets differently based on their location or, for example, distance from a central axis. Step S221 may be performed by an array of deflectors, such as a deflector array of first deflector 950 as discussed above with reference to FIG. 15. Beamlets entering the array of deflectors may be spaced apart from one another, and deflectors of the array of lenses may deflect each of the beamlets differently based on its location. Beamlets exiting the array of deflectors may enter another optical component, such as second deflector 951.

Step S221 may include deflecting beamlets a second time. Beamlets may be deflected twice and their pitch may be adjusted while maintaining the beamlets in a particular travel direction. For example, step S221 may include deflecting beamlets by first deflector 950 to adjust their pitch, and deflecting beamlets by second deflector 951 to return the beamlets to a parallel trajectory.

Second step S220 may include a step S222 of focusing beamlets. Focusing beamlets may include compensating for focusing differences due to energy differences of the beamlets. Step S222 may include controlling first lens 960 to apply a field to beamlets passing through first lens 960. First lens 960 may include an electrostatic lens and step S222 may include applying an electrostatic field to beamlets passing through first lens 960.

Second step S220 may include a step S223 of adjusting beamlet energy. Adjusting beamlet energy may include controlling first lens 960 to apply a field that causes beamlets to be adjusted to have a predetermined energy. Step S223 may include adjusting all beamlets in a multi-beam system to have a predetermined energy. Step S223 of adjusting beamlet energy may enable monochromatic beamlets to be produced.

In second step S220, manipulation of beamlets may occur on a beamlet-by-beamlet basis. For example, an array of deflectors or lenses may be provided, and each deflector or lens in such array may be configured to influence a beamlet differently from that of another deflector or lens. Different beamlets in a system may be influenced differently based on their energy. Beamlets having different properties (e.g., energy) may be manipulated so that their properties are made uniform. For example, beamlets having different energy may be adjusted to have the same energy.

As shown in FIG. 18, a third step S230 be performed. Step S230 may include a step S231 of forming multiple beam spots on a target. Step S231 may include outputting beamlets that have an energy spread that is lower than that of an input beam. For example, an input beam may be passed through a dispersive element and an aperture array that may be configured to form beamlets each having an energy spread that is lower than that of the input beam.

Step S231 may include forming beam spots on a target. Step S231 may include focusing beamlets so as to form the beam spots. Focusing of beamlets may be performed using an objective lens. The objective lens may include a single objective lens (e.g., objective lens 959 of FIG. 17) or a plurality of objective lenses (e.g., objective lenses 970A, 970B, and 970C of FIG. 16). The beamlets input into the objective lens may be uniformized (e.g., made to be monochromatic), and the objective lens may be configured to influence the beamlets uniformly.

Step S231 may include further processing of beamlets. Step S231 may include deflecting beamlets before inputting the beamlets into an objective lens. For example, third deflector 952 (see FIG. 17) may be provided. Beamlets may be deflected so as to enter the objective lens with predetermined angles or positions. Beamlets may be deflected so as to form beam spots with a predetermined pitch.

In some embodiments, beamlets may be deflected so that they converge to a common focal point or image plane downstream from a focusing lens. For example, beamlets may be deflected so as to form common focal point 860, discussed above with respect to FIG. 10B. In some embodiments, however, beamlets may be deflected so that they form separate beam spots on a target.

The embodiments may further be described using the following clauses:

1. A method of reducing aberration, comprising:
   separating charged particles of a beam based on energy of the charged particles to form beamlets, each of the beamlets configured to include charged particles at a central energy level; and
   deflecting the beamlets so that beamlets having different central energy levels are deflected differently.
2. The method of clause 1, wherein each of the beamlets is configured to include charged particles within a range that includes the central energy level.
3. The method of clause 1 or clause 2, further comprising:
   focusing the beamlets so that a substantially common focal point is formed.
4. The method of clause 1 or clause 2, further comprising:
   focusing the beamlets so that each of the beamlets form an image plane at substantially the same location.
5. The method of any one of clauses 1-4, wherein deflecting the beamlets includes altering trajectories of the beamlets as the beamlets pass through a deflector array.

6. The method of any one of clauses 1-5, further comprising:
transmitting the beamlets through a focusing lens, wherein beamlets are input into the focusing lens with different angles according to energy of the beamlets.
7. The method of any one of clauses 1-6, further comprising:
transmitting the beamlets through an aperture array so that beamlets of different energy pass through different openings of the aperture array.
8. The method of clause 7, further comprising:
outputting beamlets from the aperture array so that each of the beamlets has an energy spread that is lower than that of the beam.
9. The method of any one of clauses 1-8, wherein energy of the beamlets includes, for each beamlet, a central energy level and a range of energies of particles included in the beamlet.
10. The method of clause 9, further comprising:
trimming beamlets so that particles included in a beamlet having energy at a periphery of the range are cut off.
11. The method of any one of clauses 1-10, wherein separating of the beam into the beamlets includes transmitting the beam through a dispersive element so that charged particles of different energy become further spaced apart from one another.
12. The method of any one of clauses 1-11, wherein deflecting the beamlets includes adjusting beamlet positions or beamlet angles so as to compensate for chromatic aberration.
13. The method of any one of clauses 1-12, further comprising:
determining a chromatic aberration coefficient of a system; and
deflecting the beamlets so as to reduce the chromatic aberration coefficient.
14. The method of any one of clauses 1-13, further comprising:
adjusting a focus of the beamlets so as to compensate for field curvature aberration.
15. The method of any one of clauses 1-14, further comprising:
adjusting beam profile of the beamlets so as to compensate for astigmatism aberration.
16. The method of any one of clauses 1-11, wherein:
deflecting the beamlets includes adjusting beamlet entry positions and beamlet entry angles into a lens so as to compensate for chromatic aberration of the lens, and
the beamlets are focused by a lens array prior to entering the lens so as to compensate for field curvature aberration of the lens.
17. An aberration corrector, comprising:
a dispersive element configured to cause constituent parts of a beam to spread apart based on energy;
an aperture array configured to form beamlets from the spread apart beam; and
a deflector array configured to deflect the beamlets differently based on central energy levels of particles that form the beamlets.
18. The aberration corrector of clause 17, wherein the constituent parts include particles within a range around a central energy level of a beamlet.
19. The aberration corrector of clause 18, wherein the particles include electrons.
20. The aberration corrector of clause 17, wherein the dispersive element is configured to cause the constituent parts of the beam to spread apart based on energy by altering a trajectory of each of the constituent parts travelling through the dispersive element such that the constituent parts become spaced apart from one another.
21. The aberration corrector of any one of clauses 17-20, wherein the aperture array includes a plurality of openings and the deflector array includes a plurality of deflectors, each of the deflectors aligned with an opening of the aperture array.
22. The aberration corrector of clause 17, wherein the aperture array is configured to output the beamlets such that particles forming each beamlet are within a range around a central energy level, and to cut off particles included in the beam having energy at a periphery of the range.
23. The aberration corrector of one of clauses 17-22, further comprising:
a focusing lens, wherein the deflector array is configured to adjust beamlet entry positions and beamlet entry angles into the focusing lens so as to compensate for chromatic aberration of the lens.
24. The aberration corrector of one of clauses 17-23, further comprising
a lens array adjacent to the deflector array and configured to focus the beamlets differently so as to compensate for field curvature aberration.
25. The aberration corrector of clause 24, wherein the lens array includes a plurality of micro lenses that are configured so as to focus the beamlets differently based on a distance from a central axis of the lens array.
26. The aberration corrector of clause 24, wherein the lens array includes a first lens array configured to compensate for field curvature aberration and a second lens array configured to compensate for astigmatism aberration.
27. The aberration corrector of clause 26, wherein the second lens array includes an array of multipole micro lenses.
28. The aberration corrector of clause 17, wherein the dispersive element is configured to generate a magnetic field.
29. The aberration corrector of clause 17, wherein the dispersive element includes a component of a charged particle beam system.
30. The aberration corrector of clause 29, wherein the dispersive element includes a beam separator.
31. A method comprising:
transmitting particles of an input charged particle beam through a dispersive element that causes the input charged particle beam to form a spread beam such that particles of different energy traversing a substantially same path prior to entering the dispersive element are further apart from one another in the spread beam, and such that particles of similar energy traveling different paths prior to entering the dispersive element are closer together in the spread beam;
transmitting the spread beam through an aperture array so as to form a plurality of beamlets having different central energies of constituent charged particles, wherein each beamlet includes particles with a reduced energy spread relative to the input charged particle beam;
deflecting the beamlets with micro deflectors so as to cause the beamlets to enter a lens at an angle that improves a focus of the beamlets on a target; and
focusing the beamlets toward the target with the lens.

32. The method of clause 31, further comprising:
modifying a focus of a first set of the beamlets with micro lenses so as to improve a focus of the first set of the beamlets on the target.

33. A method of producing monochromatic beamlets, comprising:
separating charged particles of a beam based on energy of the charged particles to form beamlets, each of the beamlets configured to include charged particles at a corresponding central energy level;
adjusting a central energy level of a beamlet; and
projecting the beamlets onto a target.

34. The method of clause 33, wherein each of the beamlets is configured to include charged particles within a range that includes the central energy level.

35. The method of clause 33 or clause 34, further comprising:
deflecting the beamlets so as to adjust a pitch of the beamlets.

36. The method of any of clauses 33-35, further comprising:
focusing the beamlets so that the beamlets form beam spots on the target.

37. The method of any one of clauses 33-36, further comprising:
deflecting the beamlets so that beamlets having different central energy levels are deflected differently.

38. The method of clause 37, wherein deflecting the beamlets includes altering trajectories of the beamlets as the beamlets pass through a deflector array.

39. The method of clause 35, wherein deflecting the beamlets includes:
first deflecting the beamlets so as to adjust the pitch of the beamlets; and
second deflecting the beamlets so that the beamlets have parallel trajectories.

40. The method of any one of clauses 33-49, wherein adjusting the central energy level of the beamlet includes adjusting the central energy level of the beamlet to a predetermined energy level.

41. The method of any one of clauses 33-40, further comprising:
adjusting the central energy level of all the beamlets.

42. The method of any one of clauses 33-41, further comprising:
outputting beamlets from the aperture array so that each of the beamlets has an energy spread that is lower than that of the beam 43. The method of any one of clauses 33-42, wherein energy of the beamlets includes, for each beamlet, a range of energies of particles included in the beamlet around the central energy level.

44. The method of clause 43, further comprising:
trimming beamlets so that particles included in a beamlet having energy at a periphery of the range are cut off.

45. The method of any one of clauses 33-44, wherein separating of the beam into the beamlets includes transmitting the beam through a dispersive element so that charged particles of different energy become further spaced apart from one another.

46. The method of clause 36, wherein the focusing includes transmitting the beamlets through an objective lens.

47. The method of clause 46, wherein a separate objective lens is provided for each of the beamlets.

48. The method of clause 46, wherein a single objective lens is provided for all of the beamlets.

49. The method of any one of clauses 33-48, further comprising:
focusing beamlets so that beamlets having different central energy levels are focused differently.

50. A charged particle beam apparatus, comprising:
a dispersive element configured to cause constituent parts of a beam to spread apart based on energy;
an aperture array configured to form beamlets from the spread apart beam;
a first lens configured to adjust a central energy level of a beamlet; and
a second lens configured to project the beamlets onto a target.

51. The apparatus of clause 50, wherein the constituent parts include particles within a range around a central energy level of a beamlet.

52. The apparatus of clause 51, wherein the particles include electrons.

53. The apparatus of any one of clauses 50-52, wherein the dispersive element is configured to cause the constituent parts of the beam to spread apart based on energy by altering a trajectory of each of the constituent parts travelling through the dispersive element such that the constituent parts become spaced apart from one another.

54. The apparatus of any one of clauses 50-53, further comprising a first deflector array configured to adjust a pitch of the beamlets, wherein the aperture array includes a plurality of openings and the first deflector array includes a plurality of deflectors, each of the deflectors aligned with an opening of the aperture array.

55. The apparatus of any one of clauses 50-54, wherein the first lens includes an array of lenses, each of the lenses configured to adjust the central energy level of a respective beamlet differently.

56. The apparatus of clause 55, wherein the first lens includes lenses configured to focus each of the beamlets differently.

57. The apparatus of any one of clauses 50-56, wherein the second lens includes a plurality of objective lenses each configured to form a beam spot of a respective beamlet on the target.

58. The apparatus of any one of clauses 50-56, wherein the second lens includes a single objective lens configured to form a plurality of beam spots on the target.

59. The apparatus of clause 54, further comprising a second deflector array configured to deflect the beamlets so that the beamlets have parallel trajectories.

60. The apparatus of any one of clauses 50-59, wherein the dispersive element is configured to generate a magnetic field.

61. The apparatus of any one of clauses 50-60, wherein the dispersive element includes a beam separator of a charged particle beam system.

62. A computer readable medium storing a set of instructions that are executable by one or more processors of a system to cause the system to perform a method comprising:
separating charged particles of a beam based on energy of the charged particles to form beamlets, each of the beamlets configured to include charged particles at a central energy level; and
deflecting the beamlets so that beamlets having different central energy levels are deflected differently.

63. The medium of clause 62, wherein each of the beamlets is configured to include charged particles within a range that includes the central energy level.

64. The medium of clause 62 or clause 63, wherein the set of instructions are executable by one or more processors of the system to cause the system to further perform:
focusing the beamlets so that a substantially common focal point is formed.

65. The medium of clause 62 or clause 63, wherein the set of instructions are executable by one or more processors of the system to cause the system to further perform:
focusing the beamlets so that each of the beamlets form an image plane at substantially the same location.

66. The medium of any one of clauses 62-65, wherein deflecting the beamlets includes altering trajectories of the beamlets as the beamlets pass through a deflector array.

67. The medium of any one of clauses 62-66, wherein the set of instructions are executable by one or more processors of the system to cause the system to further perform:
transmitting the beamlets through a focusing lens, wherein beamlets are input into the focusing lens with different angles according to energy of the beamlets.

68. The medium of any one of clauses 62-67, wherein the set of instructions are executable by one or more processors of the system to cause the system to further perform:
transmitting the beamlets through an aperture array so that beamlets of different energy pass through different openings of the aperture array.

69. The medium of clause 68, wherein the set of instructions are executable by one or more processors of the system to cause the system to further perform:
outputting beamlets from the aperture array so that each of the beamlets has an energy spread that is lower than that of the beam.

70. The medium of any one of clauses 62-69, wherein energy of the beamlets includes, for each beamlet, a central energy level and a range of energies of particles included in the beamlet.

71. The medium of clause 70, further comprising:
trimming beamlets so that particles included in a beamlet having energy at a periphery of the range are cut off.

72. The medium of any one of clauses 62-71, wherein separating of the beam into the beamlets includes transmitting the beam through a dispersive element so that charged particles of different energy become further spaced apart from one another.

73. The medium of any one of clauses 62-72, wherein deflecting the beamlets includes adjusting beamlet positions or beamlet angles so as to compensate for chromatic aberration.

74. The medium of any one of clauses 62-73, wherein the set of instructions are executable by one or more processors of the system to cause the system to further perform:
determining a chromatic aberration coefficient of a system; and
deflecting the beamlets so as to reduce the chromatic aberration coefficient.

75. The medium of any one of clauses 62-74, wherein the set of instructions are executable by one or more processors of the system to cause the system to further perform:
adjusting a focus of the beamlets so as to compensate for field curvature aberration.

76. The medium of any one of clauses 62-75, wherein the set of instructions are executable by one or more processors of the system to cause the system to further perform:
adjusting beam profile of the beamlets so as to compensate for astigmatism aberration.

77. The medium of any one of clauses 62-76, wherein:
deflecting the beamlets includes adjusting beamlet entry positions and beamlet entry angles into a lens so as to compensate for chromatic aberration of the lens, and
the beamlets are focused by a lens array prior to entering the lens so as to compensate for field curvature aberration of the lens.

78. A computer readable medium storing a set of instructions that are executable by one or more processors of a system to cause the system to perform a method comprising:
transmitting particles of an input charged particle beam through a dispersive element that causes the input charged particle beam to form a spread beam such that particles of different energy traversing a substantially same path prior to entering the dispersive element are further apart from one another in the spread beam, and such that particles of similar energy traveling different paths prior to entering the dispersive element are closer together in the spread beam;
transmitting the spread beam through an aperture array so as to form a plurality of beamlets having different central energies of constituent charged particles, wherein each beamlet includes particles with a reduced energy spread relative to the input charged particle beam;
deflecting the beamlets with micro deflectors so as to cause the beamlets to enter a lens at an angle that improves a focus of the beamlets on a target; and
focusing the beamlets toward the target with the lens.

79. The medium of clause 78, wherein the set of instructions are executable by one or more processors of the system to cause the system to further perform:
modifying a focus of a first set of the beamlets with micro lenses so as to improve a focus of the first set of the beamlets on the target.

80. A computer readable medium storing a set of instructions that are executable by one or more processors of a system to cause the system to perform a method comprising:
separating charged particles of a beam based on energy of the charged particles to form beamlets, each of the beamlets configured to include charged particles at a corresponding central energy level;
adjusting a central energy level of a beamlet; and
projecting the beamlets onto a target.

81. The medium of clause 80, wherein each of the beamlets is configured to include charged particles within a range that includes the central energy level.

82. The medium of clause 80 or clause 81, wherein the set of instructions are executable by one or more processors of the system to cause the system to further perform:
deflecting the beamlets so as to adjust a pitch of the beamlets.

83. The medium of any of clauses 80-82, wherein the set of instructions are executable by one or more processors of the system to cause the system to further perform:
focusing the beamlets so that the beamlets form beam spots on the target.

84. The medium of any one of clauses 80-83, wherein the set of instructions are executable by one or more processors of the system to cause the system to further perform:
deflecting the beamlets so that beamlets having different central energy levels are deflected differently.
85. The medium of clause 84, wherein deflecting the beamlets includes altering trajectories of the beamlets as the beamlets pass through a deflector array.
86. The medium of clause 85, wherein deflecting the beamlets includes:
first deflecting the beamlets so as to adjust the pitch of the beamlets; and
second deflecting the beamlets so that the beamlets have parallel trajectories.
87. The medium of any one of clauses 80-86, wherein adjusting the central energy level of the beamlet includes adjusting the central energy level of the beamlet to a predetermined energy level.
88. The medium of any one of clauses 80-87, wherein the set of instructions are executable by one or more processors of the system to cause the system to further perform:
adjusting the central energy level of all the beamlets.
89. The medium of any one of clauses 80-88, wherein the set of instructions are executable by one or more processors of the system to cause the system to further perform:
outputting beamlets from the aperture array so that each of the beamlets has an energy spread that is lower than that of the beam
90. The medium of any one of clauses 80-89, wherein energy of the beamlets includes, for each beamlet, a range of energies of particles included in the beamlet around the central energy level.
91. The medium of clause 90, wherein the set of instructions are executable by one or more processors of the system to cause the system to further perform:
trimming beamlets so that particles included in a beamlet having energy at a periphery of the range are cut off.
92. The medium of any one of clauses 80-91, wherein separating of the beam into the beamlets includes transmitting the beam through a dispersive element so that charged particles of different energy become further spaced apart from one another.
93. The medium of clause 83, wherein the focusing includes transmitting the beamlets through an objective lens.
94. The medium of clause 93, wherein a separate objective lens is provided for each of the beamlets.
95. The medium of clause 93, wherein a single objective lens is provided for all of the beamlets.
96. The medium of any one of clauses 80-95, wherein the set of instructions are executable by one or more processors of the system to cause the system to further perform:
focusing beamlets so that beamlets having different central energy levels are focused differently.

In some embodiments, a controller may control a charged particle beam system. The controller may include a computer processor. The controller may instruct components of the charged particle beam system to perform various functions, such as controlling a charged particle source to generate a charged particle beam and controlling deflectors of a deflector array to deflect beamlets based on their energy. The controller may also perform functions of determining chromatic aberration coefficient, performing image acquisition, image processing, etc. The controller may comprise a storage that is a storage medium such as a hard disk, cloud storage, random access memory (RAM), other types of computer readable memory, and the like. The controller may communicate with a cloud storage. A non-transitory computer readable medium may be provided that stores instructions for a processor of controller 109 to carry out beam forming, or other functions and methods consistent with the present disclosure. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

The block diagrams in the figures may illustrate the architecture, functionality, and operation of possible implementations of systems, methods, and computer hardware or software products according to various exemplary embodiments of the present disclosure. In this regard, each block in a schematic diagram may represent certain arithmetical or logical operation processing that may be implemented using hardware such as an electronic circuit. Blocks may also represent a module, segment, or portion of code that comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. For example, step S121 of deflecting beamlets and step S122 of focusing beamlets may occur in an order that may be determined by an arrangement of a lens array and deflector array. Furthermore, steps such as compensating for astigmatism, or other distortion, may be added. It should also be understood that each block of the block diagrams, and combination of the blocks, may be implemented by special purpose hardware-based systems that perform the specified functions or acts, or by combinations of special purpose hardware and computer instructions.

It will be appreciated that the embodiments of the present disclosure are not limited to the exact construction that has been described above and illustrated in the accompanying drawings, and that various modifications and changes can be made without departing from the scope thereof. For example, one or more lenses or other optical components may be added at various points to the particular constructions of exemplary particle-optical system discussed herein. Optical components may be provided for, e.g., magnifying, zooming, and image anti-rotating etc.

The invention claimed is:
1. A method of reducing aberration, comprising:
separating charged particles of a beam based on energy of the charged particles to form beamlets, each of the beamlets configured to include charged particles at a central energy level; and
deflecting the beamlets so that beamlets having different central energy levels are deflected differently.
2. An aberration corrector, comprising:
a dispersive element configured to cause constituent parts of a beam to spread apart based on energy;
an aperture array configured to form beamlets from the spread apart beam; and a deflector array configured to deflect the beamlets differently based on central energy levels of particles that form the beamlets.

3. The aberration corrector of claim 2, wherein the constituent parts include particles within a range around a central energy level of a beamlet.

4. The aberration corrector of claim 3, wherein the particles include electrons.

5. The aberration corrector of claim 2, wherein the dispersive element is configured to cause the constituent parts of the beam to spread apart based on energy by altering a trajectory of each of the constituent parts travelling through the dispersive element such that the constituent parts become spaced apart from one another.

6. The aberration corrector of claim 2, wherein the aperture array includes a plurality of openings and the deflector array includes a plurality of deflectors, each of the deflectors aligned with an opening of the aperture array.

7. The aberration corrector of claim 2, wherein the aperture array is configured to output the beamlets such that particles forming each beamlet are within a range around a central energy level, and to cut off particles included in the beam having energy at a periphery of the range.

8. The aberration corrector of claim 2, further comprising:
a focusing lens, wherein the deflector array is configured to adjust beamlet entry positions and beamlet entry angles into the focusing lens so as to compensate for chromatic aberration of the lens.

9. The aberration corrector of claim 2, further comprising a lens array adjacent to the deflector array and configured to focus the beamlets differently so as to compensate for field curvature aberration.

10. The aberration corrector of claim 9, wherein the lens array includes a plurality of micro lenses that are configured so as to focus the beamlets differently based on a distance from a central axis of the lens array.

11. The aberration corrector of claim 9, wherein the lens array includes a first lens array configured to compensate for field curvature aberration and a second lens array configured to compensate for astigmatism aberration.

12. The aberration corrector of claim 11, wherein the second lens array includes an array of multipole micro lenses.

13. The aberration corrector of claim 2, wherein the dispersive element is configured to generate a magnetic field.

14. The aberration corrector of claim 2, wherein the dispersive element includes a component of a charged particle beam system.

15. The aberration corrector of claim 14, wherein the dispersive element includes a beam separator.

* * * * *